(12) United States Patent
Galbi et al.

(10) Patent No.: US 12,639,219 B2
(45) Date of Patent: May 26, 2026

(54) FLEXIBLE CONFIGURATION OF MEMORY MODULE DATA WIDTH

(71) Applicant: Intel Corporation, Santa Clara, CA (US)

(72) Inventors: Duane E. Galbi, Wayland, MA (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 315 days.

(21) Appl. No.: 17/484,418

(22) Filed: Sep. 24, 2021

(65) Prior Publication Data

US 2022/0012173 A1 Jan. 13, 2022

(51) Int. Cl.
*G06F 12/06* (2006.01)
*G06F 13/16* (2006.01)
*G11C 11/407* (2006.01)

(52) U.S. Cl.
CPC ...... *G06F 12/0646* (2013.01); *G06F 13/1668* (2013.01); *G06F 2212/1008* (2013.01); *G11C 11/407* (2013.01)

(58) Field of Classification Search
CPC ............. G06F 12/0646; G06F 13/1668; G06F 2212/1008; G11C 7/1045; G11C 7/1048; G11C 7/1051; G11C 7/1078; G11C 11/407; G11C 11/4093; G11C 2207/105; G11C 2207/108
See application file for complete search history.

(56) References Cited

U.S. PATENT DOCUMENTS

| | | | | | |
|---|---|---|---|---|---|
| 4,398,248 | A | * | 8/1983 | Hsia | G11C 29/765 |
| | | | | | 365/230.03 |
| 5,687,392 | A | * | 11/1997 | Radko | G06F 13/28 |
| | | | | | 710/22 |
| 10,162,522 | B1 | | 12/2018 | Li et al. | |
| 11,308,006 | B2 | | 4/2022 | Oh et al. | |
| 2007/0061684 | A1 | * | 3/2007 | Rosenbluth | H03M 13/356 |
| | | | | | 714/766 |
| 2008/0082763 | A1 | * | 4/2008 | Rajan | G11C 11/4074 |
| | | | | | 711/154 |
| 2008/0114906 | A1 | * | 5/2008 | Hummel | G06F 12/0284 |
| | | | | | 710/22 |
| 2010/0030980 | A1 | * | 2/2010 | Yamada | G06T 1/60 |
| | | | | | 711/E12.001 |
| 2016/0314822 | A1 | * | 10/2016 | Yeung | H03K 19/1778 |
| 2019/0043552 | A1 | | 2/2019 | Alameer et al. | |
| 2019/0050325 | A1 | | 2/2019 | Malladi et al. | |
| 2019/0179791 | A1 | | 6/2019 | Shokrollahi et al. | |

* cited by examiner

*Primary Examiner* — Aracelis Ruiz

(74) *Attorney, Agent, or Firm* — Compass IP Law PC

(57) ABSTRACT

A memory system has a configurable mapping of address space of a memory array to address of a memory access command. In response to a memory access command, a memory device can apply a traditional mapping of the command address to the address space, or can apply an address remapping to remap the command address to different address space.

20 Claims, 13 Drawing Sheets

500

| ADDRESS | DRAM 1 | DRAM 2 | DRAM 3 | DRAM 4 | DRAM 5 | DRAM 6 |
|---------|--------|--------|--------|--------|--------|--------|
| 0x0 | 0 | 0 | 0 | 0 | 16 | 16 |
| 0x1 | 1 | 1 | 1 | 1 | 17 | 17 |
| 0x2 | 2 | 2 | 2 | 2 | 18 | 18 |
| 0x3 | 3 | 3 | 3 | 3 | 19 | 19 |
| 0x4 | 4 | 4 | 4 | 4 | 20 | 20 |
| 0x5 | 5 | 5 | 5 | 5 | 21 | 21 |
| 0x6 | 6 | 6 | 6 | 6 | 22 | 22 |
| 0x7 | 7 | 7 | 7 | 7 | 23 | 23 |
| 0x8 | 16 | 16 | 8 | 8 | 8 | 8 |
| 0x9 | 17 | 17 | 9 | 9 | 9 | 9 |
| 0xA | 18 | 18 | 10 | 10 | 10 | 10 |
| 0xB | 19 | 19 | 11 | 11 | 11 | 11 |
| 0xC | 20 | 20 | 12 | 12 | 12 | 12 |
| 0xD | 21 | 21 | 13 | 13 | 13 | 13 |
| 0xE | 22 | 22 | 14 | 14 | 14 | 14 |
| 0xF | 23 | 23 | 15 | 15 | 15 | 15 |

| ADDRESS | DRAM 1 | DRAM 2 | DRAM 3 |
|---------|--------|--------|--------|
| 0x0 | 0 | 0 | ADDR |
| 0x1 | 1 | 1 | ADDR |
| 0x2 | 2 | 2 | ADDR |
| 0x3 | 3 | 3 | ADDR |
| 0x4 | 4 | 4 | ADDR |
| 0x5 | 5 | 5 | ADDR |
| 0x6 | 6 | 6 | ADDR |
| 0x7 | 7 | ADDR | 7 |
| 0x8 | 8 | ADDR | 8 |
| 0x9 | 9 | ADDR | 9 |
| 0xA | 10 | ADDR | 10 |
| 0xB | 11 | ADDR | 11 |
| 0xC | 12 | ADDR | 12 |
| 0xD | 13 | ADDR | 13 |
| 0xE | ADDR | 14 | 14 |
| 0xF | ADDR | 15 | 15 |
| 0x10 | ADDR | 16 | 16 |
| 0x11 | ADDR | 17 | 17 |
| 0x12 | ADDR | 18 | 18 |
| 0x13 | ADDR | 19 | 19 |
| 0x14 | ADDR | 20 | 20 |

FIG. 6A

| ADDRESS | DRAM 0 | DRAM 1 | DRAM 2 | DRAM 3 | DRAM 4 | DRAM 5 | DRAM 6 | DRAM 7 | DRAM 8 | DRAM 9 |
|---|---|---|---|---|---|---|---|---|---|---|
| 0x0..0x6 | 0..6 | 0..6 | 0..6 | 0..6 | 0..6 | 0..6 | 0..6 | 0..6 | 0..6 | 64..70 |
| 0x7..0x0D | 7..13 | 7..13 | 7..13 | 7..13 | 7..13 | 7..13 | 7..13 | 7..13 | 64..70 | 7..13 |
| 0x0E..0x14 | 14..20 | 14..20 | 14..20 | 14..20 | 14..20 | 14..20 | 14..20 | 64..70 | 14..20 | 14..20 |
| 0x15..0x1B | 21..27 | 21..27 | 21..27 | 21..27 | 21..27 | 21..27 | 64..70 | 21..27 | 21..27 | 21..27 |
| 0x1C..0x22 | 28..34 | 28..34 | 28..34 | 28..34 | 28..34 | 64..70 | 28..34 | 28..34 | 28..34 | 28..34 |
| 0x23..0x29 | 35..41 | 35..41 | 35..41 | 35..41 | 64..70 | 35..41 | 35..41 | 35..41 | 35..41 | 35..41 |
| 0x2A..0x30 | 42..48 | 42..48 | 42..48 | 64..70 | 42..48 | 42..48 | 42..48 | 42..48 | 42..48 | 42..48 |
| 0x31..0x37 | 49..55 | 49..55 | 64..70 | 49..55 | 49..55 | 49..55 | 49..55 | 49..55 | 49..55 | 49..55 |
| 0x38..0x3E | 56..62 | 64..70 | 56..62 | 56..62 | 56..62 | 56..62 | 56..62 | 56..62 | 56..62 | 56..62 |
| 0x3F | 63 | 63 | 63 | 63 | 63 | 63 | 63 | 63 | 63 | 63 |

| ADDRESS | DRAM 1 | DRAM 2 | DRAM 3 |
|---|---|---|---|
| 0x0 | 0x2, 13x1, 14x1 | 0x2, 8x1, 9x1 | 0x3, 3x1 |
| 0x1 | 1x2, 15x1, 16x1 | 1x3, 10x1 | 1x2, 4x1, 5x1 |
| 0x2 | 2x3, 17x1 | 2x2, 11x1, 12x1 | 2x2, 6x1, 7x1 |
| 0x3 | 3 | 3 | ADDR |
| 0x4 | 4 | 4 | ADDR |
| 0x5 | 5 | 5 | ADDR |
| 0x6 | 6 | 6 | ADDR |
| 0x7 | 7 | 7 | ADDR |
| 0x8 | 8 | ADDR | 8 |
| 0x9 | 9 | ADDR | 9 |
| 0xA | 10 | ADDR | 10 |
| 0xB | 11 | ADDR | 11 |
| 0xC | 12 | ADDR | 12 |
| 0xD | ADDR | 13 | 13 |
| 0xE | ADDR | 14 | 14 |
| 0xF | ADDR | 15 | 15 |
| 0x10 | ADDR | 16 | 16 |
| 0x11 | ADDR | 17 | 17 |

FIG. 7

FLEXIBLE CONFIGURATION OF MEMORY MODULE DATA WIDTH

FIELD

Descriptions are generally related to computer systems, and more particular descriptions are related to data utilization of memory.

BACKGROUND

Typically, the width of the memory bus interface, in terms of the number of signal lines provided to the memory devices, needs to match the data width required by the host processor. When the memory bus interface of the memory devices does not match what is needed by the host processor, there is typically memory space that is wasted. For example, when a DRAM (dynamic random access memory) DIMM (dual inline memory module) has a hardware configuration (e.g., 10×4 or 10 DRAMs having ×4 data bus interfaces) that does not match the needs of the host (e.g., perhaps the host only needs 9×4 of the 10×4 devices), the additional DRAM device is wasted.

In a related example, if a 9.25×4 DIMM configuration is needed, such as to use an additional signal line for metadata purposes, where not all additional capacity is needed, the number of devices will need to be rounded up to an integer number. Thus, 9×4 devices would be needed, with an additional one DQ line (one quarter of a ×4 device) needed, which will require an additional device. Such a 9.25×4 configuration requires 10×4 devices on the DIMM, and the additional spaces is typically wasted, because it cannot be used in traditional systems.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 5 is a block diagram of an example of memory address remapping for a 6×8 DIMM.

FIG. 6A is a block diagram of an example of memory address remapping for a 9×4 implementation for a 10×4 DIMM.

FIG. 6B provides further detail for an implementation of FIG. 5A.

FIG. 7 is a block diagram of an example of memory address remapping for a 9.25×4 implementation for a 10×4 DIMM.

Figure 1:
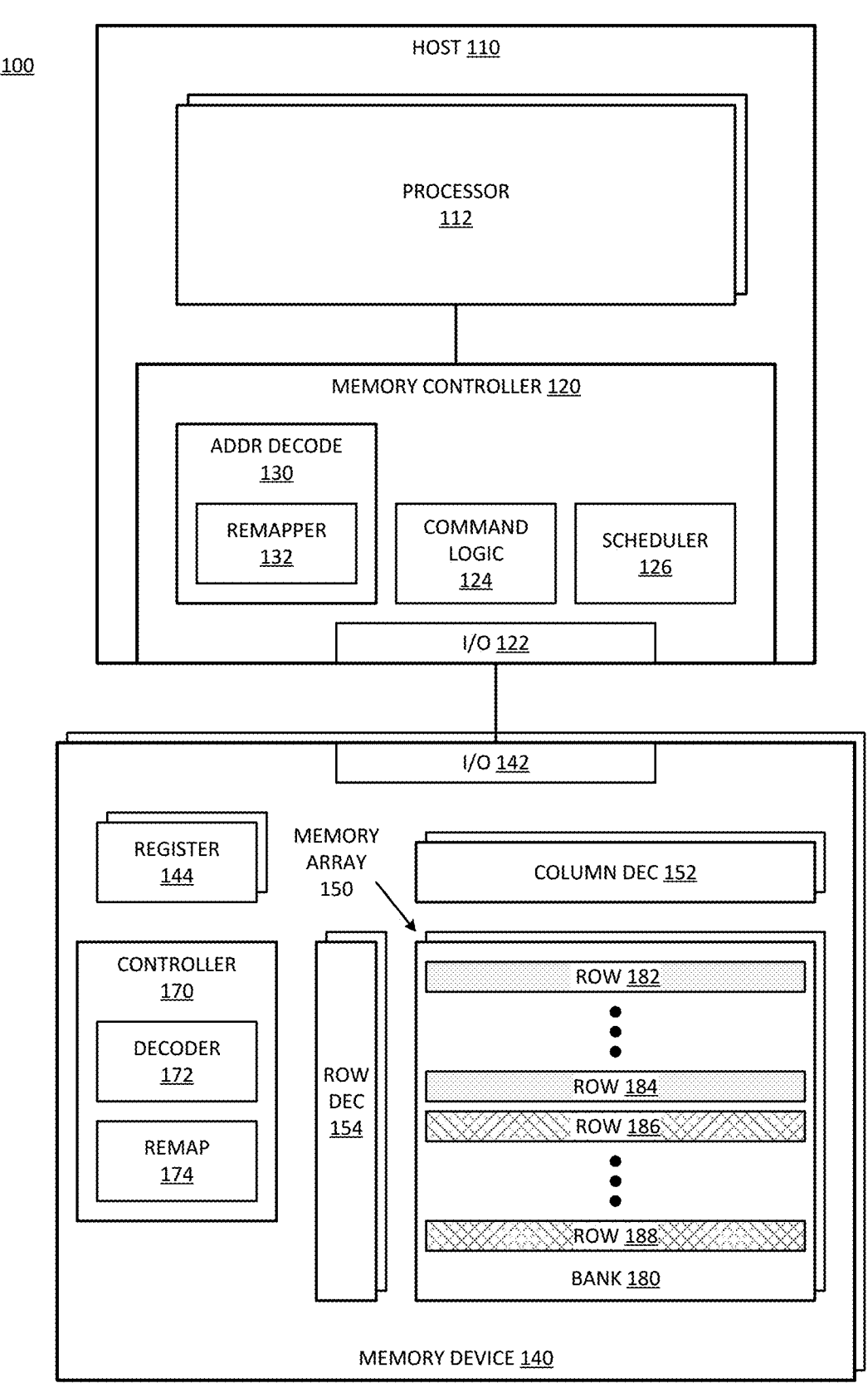
FIG. 1 is a block diagram of an example of a system with address remapping.

Descriptions of certain details and implementations follow, including non-limiting descriptions of the figures, which may depict some or all examples, and well as other potential implementations.

DETAILED DESCRIPTION

As described herein, a memory system has a configurable mapping of address space of a memory array to address of a memory access command. In response to a memory access command, a memory device can apply a traditional mapping of the command address to the address space, to apply a remapping to map the command address to a different address space. In one example, a memory device can apply an address remapping to remap the address space from the traditional mapping. Thus, when additional capacity is added for different memory configurations, the memory devices can flexibly remap the address space, resulting in better utilization of the memory space.

Descriptions throughout make reference to row address space and row address remapping. It will be understood that remapping of the row address space is merely one example. The descriptions of remapping row address space could alternatively refer to remapping of the column address space with CAS (column address selection) address bits. Thus, in one example, a command includes row address bits that can be remapped to different row address space of the memory array. In another example, a command includes column address bits that can be remapped to different column address space of the memory array. For simplicity, the descriptions refer to row address remapping, and will be understood to apply as well to column address remapping.

For purposes of description herein, reference is made to DRAM (dynamic random access memory) devices and DIMMs (dual inline memory modules). It will be understood that other types of memory device that couple together in parallel configurations can be used. In addition to DIMMs, other types of memory module that allow for the parallel connection of memory devices can be used. For example, a multichip package (MCP) with multiple memory devices in a stack can be used.

Typically, the width of the DRAM DIMM or memory stack needs to match the data width required by the SOC (system on a chip) or host. For simplicity in description, a DIMM configuration will be primary described, with application to a memory stack being understood as an alternative. The SOC or host can refer to a host processor that also includes memory controller circuitry for managing access to the DRAM DIMM. An SOC typically also includes multiple levels of cache to store data from the DIMM to enable execution of the host processor or host processing cores. If the data width required by the SOC does not match the width of the DRAM DIMM, the extra DRAM space would be wasted without the ability to flexibly remap the row address space.

Consider an example where a 10×4 DIMM configuration is available, and the host only has a data width corresponding to a 9×4 DIMM configuration. As described herein, the system can remap a portion of the row addresses of one or more of the DRAM devices to utilize more of the memory address space. The remapping of the address space will mean that the devices can be mapped to respond to memory access commands with different combinations of row address, to result in selected devices providing the data bits, with one of the devices not responding to a specific row address range. Similarly, address remapping can be used to utilize at least some of the address space of an additional DRAM device in a 9.25×4 DIMM configuration. Using a 10×4 DIMM where only a 9×4 DIMM is required will give 11% extra usable DRAM space. Using a 10×4 DIMM where only a 9.25×4 DIMM is required will result in an extra 8% usable DRAM space.

With the ability to remap the row address space of the different DRAM devices, a single memory system configuration can be used for different host configurations without sacrificing the address space. The address space remapping can be a dynamically programmable solution to reclaim the extra memory space without any performance or bandwidth overhead. The remapping will not require a change to the standard DIMM interface.

In one example, the DRAM devices include programmable registers to allow the DRAM devices, based on the address provided in a memory access command, to determine whether to self-enable itself. A memory access command can refer generally to a read access command to read data from memory, or a write access command to store data in memory. The commands are controlled by address information, including row address information. Based on a row address mapping, which can be programmable to the DRAM devices, the devices can selectively enable different I/O (input/output) for DQ (data) signal lines, based on the row address in the memory access command. For example, the DRAM device could choose to enable all its I/Os, or a just a subset of the I/O. With the DRAM device able to enable itself, no additional write enables are required to allow each DRAM device to use different enabling patterns. Thus, the host can implement write enables as traditionally done, and the DRAM devices themselves can apply the appropriate sub-enable control internally to implement the address mapping.

In one example, a memory system includes an additional DRAM Activate command where the lower address bits are remapped based on an internal programmable DRAM table. Such a technique would allow a single DIMM address to turn into unique addresses at each DRAM in the DIMM, or a single stack address into unique addresses at each DRAM in the stack. The application of such a DRAM Activate command can allow each DRAM device to use a different internal address without requiring separate address bits to be send to the different DRAM devices.

In one example, the system can control the burst length of individual DRAM devices. Thus, different DRAM devices can have different burst lengths. In one example, the remapping of address information applies to an Activate command. In one example, the remapping of address information applies to a Read command. In one example, the remapping of address information applies to a Write command. In one example, the ability to remap is hard coded into a DRAM device. In one example, the ability to remap is fully programmable. In one example, the remapping of address regions of memory can be applied differently to different regions of memory.

FIG. 1 is a block diagram of an example of a system with address remapping. System 100 illustrates memory coupled to a host. Host 110 represents a host computing system. Host 110 includes host hardware such as processor 112 and memory controller 120. The host hardware also includes hardware interconnects and driver/receiver hardware to provide the interconnection between host 110 and memory device 140. Memory device 140 represents one or more memory devices coupled to host 110. In one example, memory device 140 represents a memory module (e.g., a DIMM) with multiple memory devices. Memory controller 120 controls access to memory device 140.

Memory controller 120 includes I/O (input/output) 122, which represents interface hardware to interconnect host 110 with memory. Memory device 140 correspondingly includes I/O (input/output) 142. I/O 122 and I/O 142 can include pads, driver hardware, signal lines, and hardware elements to interconnect. The I/O can also represent control logic, such as driver software, to manage the interconnection hardware.

The host hardware supports the execution of host software on host 110. The host software can include host OS (operating system). The host OS represents a software platform under which other software will execute. During execution, software programs, including the host OS, generate requests to access memory. The requests can be directly from host OS software, from other software programs, from requests through APIs (application programming interfaces), or other mechanisms. In response to a host memory access request, memory controller 120 maps host-based addressing for memory resources to physical address locations of memory device 140.

In one example, memory controller 120 includes command logic 124, which represents logic in memory controller 120 to generate commands to send to memory device 140. Memory controller 120 includes scheduler 126 to schedule how commands will be sent to memory device 140, including controlling the timing of the commands.

In one example, memory controller 120 includes address (ADDR) decode 130. Address decode 130 represents logic in memory controller 120 to enable memory controller 120 to manage address remapping for memory devices 140. In one example, address decode 130 includes remapper 132. Remapper 132 represents logic in memory controller 120 to track how different memory devices remap their row address range. Based on knowing the mapping of row address ranges, memory controller 120 can generate commands based on different use of row address space than would traditionally be used in a mapping that maps the command address space directly to the address space of the memory array, with the same address ranges.

It will be understood that reference to remapping address space refers to proactive mapping of address space, to use address space differently. It can be considered similar to, but is different from, traditional address remapping due to failed rows. In a traditional memory device, the address of a failed row can be mapped to (or remapped to) a spare row available in the memory device. Thus, when the host makes a request on the address space, the memory device can instead access the spare address space.

With the address remapping herein, the remapping is proactive when the memory device is enabled for remapping, and the remapping is not in response to a failed address space. Rather, the remapping includes remapping of one or more regions of address space to selectively enable access to portions of memory device address space that would otherwise have rows that would not be addressable.

Address decode 130 and remapper 132 of memory controller 120 can track and manage address space based on how memory devices 140 remap their address space. Thus, memory controller 120 can be aware of the address space available for memory access operations. In one example, command logic 124 simply generates commands with row address space based on address mapping patterns, and command logic 124 and scheduler 126 do not need to provide additional commands or additional enables beyond the enables in the access commands.

Memory device 140 includes memory array 150, which represents an array of memory cells. In one example, memory array 150 is organized as multiple banks 180. Banks 180 represent addressable groups of cells. For example, the memory cells of memory array 150 can be addressable by row address, column address, and bank address. System 100 illustrates bank 180 having a range of rows, row 182 to row 184, with zero or more rows between row 182 and row 184. Bank 180 also includes a range of rows, row 186 to row 188, with zero or more rows between row 186 and row 188. Memory device 140 includes column decode (DEC) 152 to select portions of memory array 150 based on column address. Memory device 140 includes row decode (DEC) 154 to select rows of memory 150 based on row address information.

Memory device 140 includes controller 170, which represents a controller or control logic within the memory device to control operations within the memory device. In response to commands from memory controller 120, controller 170 can generate internal operations to execute the commands. The internal operations can trigger the execution of the commands as well as controlling the timing and standards compliance for the operations.

In one example, controller 170 includes decoder 172, which represents control logic to decode command and address information. Decoder 172 can provide signals to column decode 152 and row decode 154 to execute an incoming command. In one example, controller 170 includes remap 174 to remap row address space. In one example, remap 174 allows controller 170 and memory device 140 to perform address-based enable of I/O. For example, based on the address information in the command decoded by decoder 172, remap 174 can selectively enable I/O ranges of memory array 150 to access specific portions of the memory array.

In one example, remap 174 includes a 64-entry 8-bit vector array. The vector array can select an entry based on the lower 6 bits of the incoming command address. In one example, four of the bits represent the enables for the memory device I/O, and the other 4 bits of the selected vector can set the lower address bits. It will be understood that bit vectors with more bits can select more address space for remapping. The enables for the memory device I/O can refer, for example, to separate ×1 or separate ×2 portions of a ×4 device. It will be understood that the number of bits needed in the remap table or remap vector and the number of entries in the table are related to the number of addresses to remap in the system.

It will be understood that controller 170 can decode the address space and many incoming commands will not involve address remapping. It will also be understood that for the same command with the same address space, different memory devices 140 can map the address space differently, with one device not remapping the address space (e.g., using the address space directly in correlation to command address) and another device remapping the address space.

In one example, remap 174 can trigger different operation of column decode 152 or row decode 154, or of both decoding circuits. The column decode circuitry and row decode circuitry can be considered control circuitry that control access to a row of memory array 150 in response to a memory access command. The memory address command includes address information. The control circuitry can select a row based on the row address of the command and the row address mapping for the memory array.

Based on address remapping, consider that a command directed to an address range would normally select the address range of row 182 to row 184 in a traditional mapping. Instead of selecting the row address range of row 182 to row 184, consider that row decode 154 is triggered to select the row address range of row 186 to row 188. Alternatively, consider that a command directed to an address range would normally select the address range of row 186 to row 188 in a traditional mapping. Instead of selecting the row address range of row 186 to row 188, consider that row decode 154 is triggered to select the row address range of row 182 to row 184.

In one example, memory device 140 represents a DRAM device. Memory device 140 includes registers 144, which represent configuration registers for the memory device. In one example, registers 144 include mode registers. In one example, by writing to a field of register 144, memory controller 120 can place memory device 140 into a state where memory device 140 remaps its row address space.

In one example, memory device 140 includes eleven address remap registers as part of registers 144. In one example, the eleven address remap registers are address by the lower 11 addresses for each 16-address range. In one example, the address remap registers control the formation of the lowest 6 bits of the row address. In one example, each address bit can be set to either a zero (0) a one (1), or the incoming address bit. In one example, only the upper 4 bits of address are needed to specify 0, 1, or incoming address bit.

In one example, address remapping can occur due to a mode setting in a configuration register. In one example, the configuration is a fixed configuration that sets the remapping of addresses for the memory array. In one example, the configuration is a value programmable by a mode register write command to set the value to allow different configurations for the memory device. Thus, a memory device can be fixed for its remapping, or be configurable to different remapping patterns.

In one example, the address remap is triggered in response to a special Activate command. The use of a special Activate command can be a preferred remapping trigger, as the memory device could simply decode the command and remap the address in response to command and address decoding. In one example, the address remapping can be triggered in response to a special Write command. In one example, the address remapping can be triggered in response to a special Read command. To the extent special Read or Write commands are used, the system could allow relaxed timing parameters for execution of the command. The use of a special Activate command could reduce system power relative to use of other commands.

Figure 2:
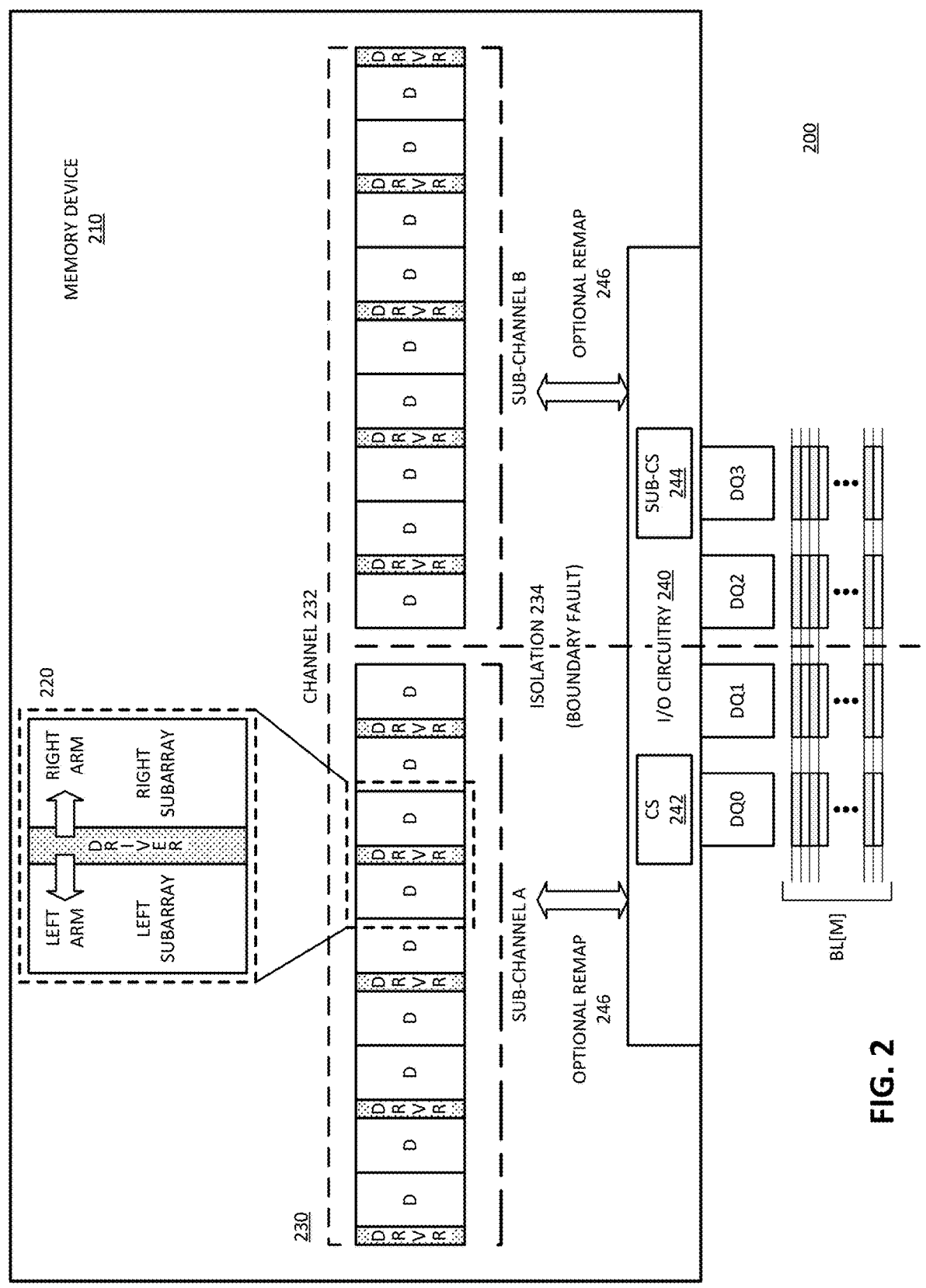
FIG. 2 is a block diagram of an example of a memory data architecture with I/O isolation for an address remapping system.

FIG. 2 is a block diagram of an example of a memory data architecture with I/O isolation for an address remapping system. System 200 represents a system in accordance with an example of system 100. System 200 includes memory device 210, which illustrates a memory array architecture to illustrate the ability to separately select portions of a memory array and separate portions of I/O.

Portion 230 represents a portion of the memory array of memory device 210. For example, portion 230 could be a row of memory 210. The width of portion 230 is the width of channel 232, which is the amount of data accessed or prefetched for a memory access command. In one example, portion 230 includes data portions with D bits and driver (DRVR) circuitry to access the D bits.

Segment 220 shows left and right sub-portions of channel 232. In one example, segment 220 includes a subwordline driver (DRVR) that drives D bits of data to each side. The bits to the left of the driver can be considered a left subarray or a left arm of the driver. Similarly, the bits to the right of the driver can considered a right subarray or a right arm of the driver. It will be understood that right and left are relative terms, and refer only to a diagrammatic orientation. In an actual implementation, the bits considered left or right could be switched.

System 200 illustrates a memory architecture with isolation. Memory device 210 is specifically illustrated with I/O circuitry 240 to interface with 4 DQ (data) signal lines, DQ[3:0]. The dashed line shows isolation 234, where DQ[0] and DQ[1] can be treated separately from DQ[2] and DQ[3]. Thus, for example, in response to a boundary fault (or bounded fault (BF)), system 200 can separately use half of the I/O. For example, if DQ[0:1] has a fault, DQ[2:3] could still be available for use. Similarly, if DQ[2:3] experienced a fault, DQ[0:1] could still be available for use. In general, a bounded fault can refer to a condition where a read fault domain spans a limited number of DQ I/O. Thus, BF regions can be less than the write enable region. For example, in the ×4 configuration of system 200, memory device 210 could have a write enable for all four DQ signal lines, and have a read bounded fault across only two of the DQ I/O.

Channel 232, which provides data to I/O circuitry 240, can be treated as sub-channel A and sub-channel B. Sub-channel A can provide data for DQ[0:1] and sub-channel B can provide data for DQ[2:3]. In one example, system 200 can provide an optional remap 246 of the I/O along the boundary of isolation 234. Optional remap 246 can enable memory device 210 to apply a different mapping of row address space than a traditional mapping that maps address space corresponding to the command address. With the remapping, memory device 210 can access different rows or different portions of memory than indicated by the address of an access command.

In one example, I/O circuitry 240 includes chip select (CS) circuitry CS 242 and sub-chip select circuitry sub-CS 244. CS 242 can represent any traditional circuitry for chip select. Typically, a chip select is command signal line of the system to select which memory devices should execute a command indicated on the other command signal lines. Sub-CS 244 represents the ability of memory device 210 to provide finer-grain selection control. Sub-CS 244 illustrates that memory device 210 can select portions of the DQ signal lines for signaling.

System 200 illustrates the burst length of M cycles (BL[M]), where data is transferred on each of the DQ I/O for each cycle of the burst. The bits fetched for a read or the bits received for a write will be transferred over multiple cycles of the burst for a total number of bits from each DQ pin.

For a Write operation, data is received at I/O circuitry 240, and provided from the I/O circuitry to selected locations of the sense amplifier circuit to write to the memory array. For optional remap 246, the location of the write will be selected by a remap pattern. For a Read operation, data is prefetched from the memory array, into the sense amplifier circuitry, and provided to I/O circuitry 240. For optional remap 246, the prefetch will come from a row indicated by the address remap rather than the address of the command.

The boundary fault can alternatively be indicated as a bounded fault. The ability to select only a portion of the I/O enables the system to treat a set of I/O as separate chips or separately enabled I/O. For example, a 9×4 system where each memory device can separately enable each half of its DQ I/O can allow the system to treat it as an 18×2 system for bounded faults.

Whether controlled by a command (e.g., activate command, write command, read command), or a mode register configuration, the operation of the memory device can switch between modes of configuration for a system. For example, a native configuration can be modified to a different configuration based on row address remapping. The native configuration refers to the configuration of the system in a mapping of row address to the memory arrays of the memory devices based on the address of the command.

System 200 does not explicitly show the memory controller associated with memory device 210. It will be understood that memory device 210 will respond to commands from the memory controller. The controller will be aware of the configuration of each memory device in a DIMM or other module. The controller will apply different addressing to different DIMMs based on the configurations for the DIMMs. In one example, a single controller will connect to at least two DIMMs, and the different DIMMs can have different configurations. Based on the configuration, the controller will know which memory devices will apply which mapping pattern, enabling the controller to appropriately address commands to the DIMMs.

Figure 3:
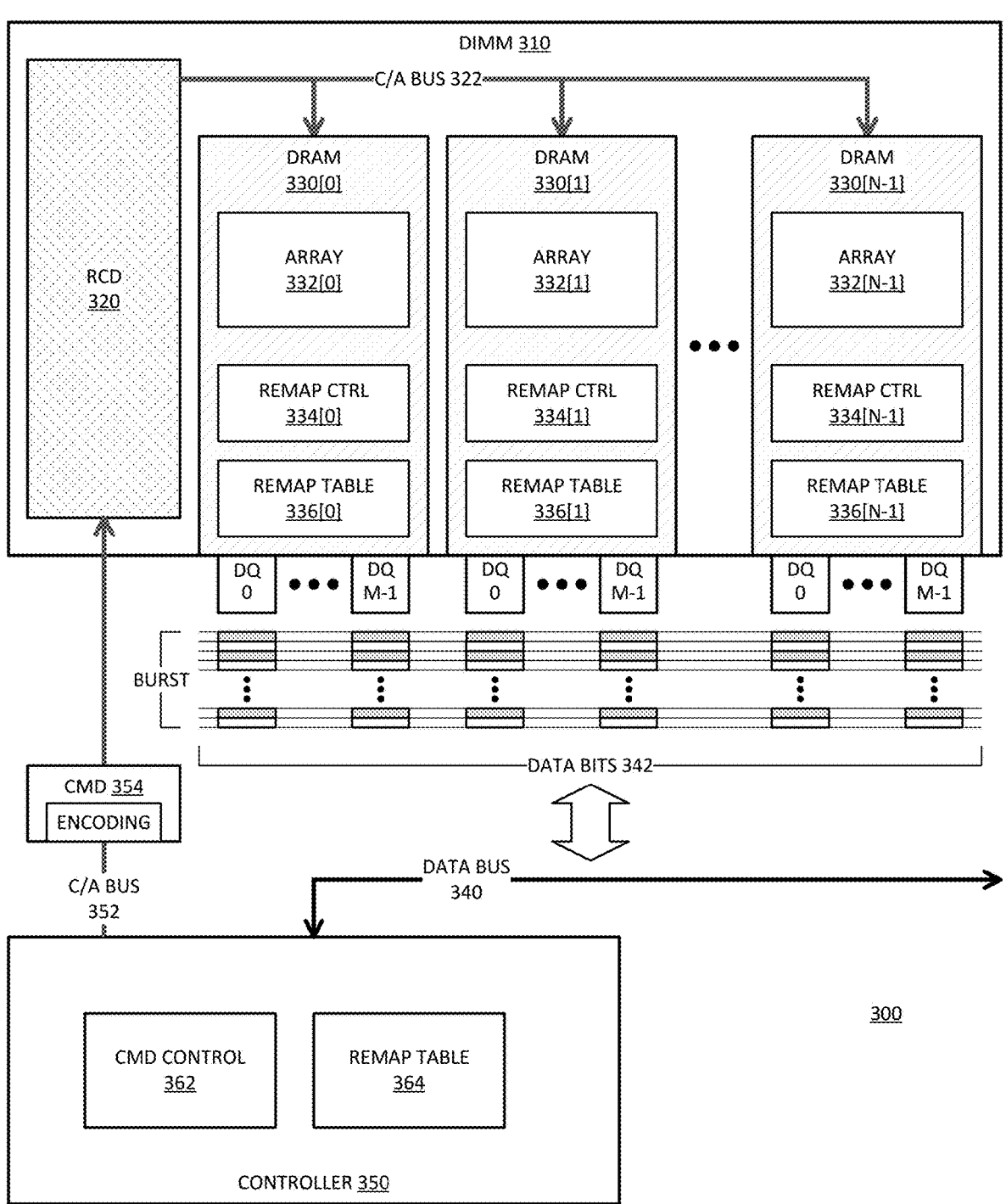
FIG. 3 is a block diagram of an example of a system architecture for a DIMM to implement memory address remapping.

FIG. 3 is a block diagram of an example of a system architecture for a DIMM to implement memory address remapping. System 300 represents a system in accordance with an example of system 100 or an example of system 200.

System 300 illustrates one example of DIMM 310 with RCD (registered clock driver) 320 and memory devices. RCD 320 represents a controller for DIMM 310. In one example, RCD 320 receives information from controller 350 and buffers the signals to the memory devices over C/A (command/address) bus 322, which represents the command bus on DIMM 310 as controlled by RCD 320. C/A bus 322 is typically a unilateral bus or unidirectional bus to carry command and address information from controller 350 to the memory devices.

The memory devices are represented as DRAM devices 330[0:(N−1)], or collectively, DRAM devices 330. System 300 shows only one channel for simplicity, but it will be understood that DIMM 310 can have multiple channels, or DIMM 310 can be part of more DIMMs on channel. DIMM 310 includes N data DRAM devices, data DRAMs 330[0:(N−1)], where N can be any integer.

Data bus 340 represents a bus to exchange data between DRAM devices 330 and controller 350. Data bus 340 is traditionally a bidirectional, point-to-point bus. For simplicity, system 300 does not illustrate control signal lines from DRAM devices 330 to controller 350.

DRAM devices 330 are illustrated as having a ×M interface, with M data bus pins, DQ[0:(M−1)]. M can be any integer and is typically a binary integer such as 4, 8, or 16. Each DQ interface will transmit data bits over a burst length, such as BL16 for a 16 unit interval or transfer cycle data exchange. In one example, the data output of the M pads or pins over the burst length will represent a number of bits, such as 32 bits or 64 bits.

Controller 350 receives data bits 342 from DRAM devices 330 as input data on data bus 340 for a Read, and provides data bits 342 to DRAM devices 330 as output data on data bus 340 for a Write. The Read or Write data is sent on the data bus corresponding to a command sent on C/A (command/address) bus 352. The command sent on C/A bus 352 includes address information, which DRAM devices 330 may apply directly for the data access operation, or they may remap the address information.

Controller 350 includes command (CMD) control 362, which represents logic at controller 350 to send commands to DRAM devices 330. In one example, controller 350 includes remap table 364, which represents a table or other store of data to indicate how DRAM devices 330 are configured to interpret address information.

In one example, controller 350 sends command (CMD) 354 on C/A bus 352. Command 354 has command encoding that indicates what type of command is being sent to the DRAM devices. In one example, command 354 includes command encoding that indicates a remap mode, to trigger DRAM devices 330 to remap the address information associated with the command to access different parts of the memory.

DRAM devices 330[0:(N−1)] respectively include array 332[0:(N−1)] (collectively, array 332), remap control (CTRL) 334[0:(N−1)] (collectively, remap control 334), and remap table 336[0:(N−1)] (collectively, remap table 336). Array 332 represents the arrays of the DRAM devices. Remap control 334 represents control logic in DRAM devices 330 to selectively remap address information received in a data access command from controller 350. Remap table 336 represents a table of information to identify the pattern of data remapping to be applied by a respective DRAM device 330.

Consider that controller 350 sends command 354, which includes a command encoding to indicate that DRAM devices 330 should remap the address information received. Any two adjacent DRAM devices 330 could apply the same remap control, or could apply different remap control, depending on the pattern or configuration of remap table 336. Thus, DRAM device 330[0] could apply the same mapping as DRAM device 330[1], which could both be different than DRAM device 330[N−1]. In another example, DRAM device 330[0], DRAM device 330[1], and DRAM device 330[N−1] could all apply different mapping of address information. Examples follow in FIG. 5, FIG. 6A, FIG. 6B, and FIG. 7 of different address mapping patterns.

In one example, remap control 334 includes the ability to internally generate a write enable (WR_EN) or a read enable (RD_EN) to implement the remapping. Remap control 334 can receive the address information of command 354, access remap table 336, and set appropriate bits to enable the accessing to the desired rows or columns. The write enable and read enable in the DRAM devices can be fine-grained control to enable elaborate remapping patterns. Sub-write-enable control is needed for some remapping patterns, instead of simple chip enable (CE), which would typically be sufficient. Some remap patterns can be accomplished with CE. In one example, controller 350 only provides the CE signal, and DRAM devices 330 internally generate additional enable control to implement the remap pattern.

With specific enable control, the row address or cacheline can be spread across DRAM devices 330 in configurable ways. With the control in system 300, a single DIMM 310 can be used for different applications that require different DIMM data widths, without needing to change the hardware configuration of the DIMM, and without wasting additional DRAM space. Thus, in system 300, the effective width of DIMM 310 can be varied for different regions of memory. In different configurations, system 300 can allow DRAM space for extra metadata to be allocated without wasting any extra DRAM space or requiring the DRAM to be a different internal size.

For ×4 DRAM devices, an implementation of system 300 could support the following DIMM channel solutions: 11×4 full SDDC (single device data correction) coverage with added metadata; 10×4 full SDDC coverage with added metadata, or bounded fault coverage with added metadata; 9×4 error detection or bounded fault SDDC; or, 8×4 with no ECC. For ×8 DRAM devices, an implementation of system 300 could support the following DIMM channel solutions: 6×8 full SDDC coverage; 6×8 BF (bounded fault) SDDC coverage and added metadata; 5×8 BF SDDC coverage; or, 4×8 with no ECC.

Figure 4:
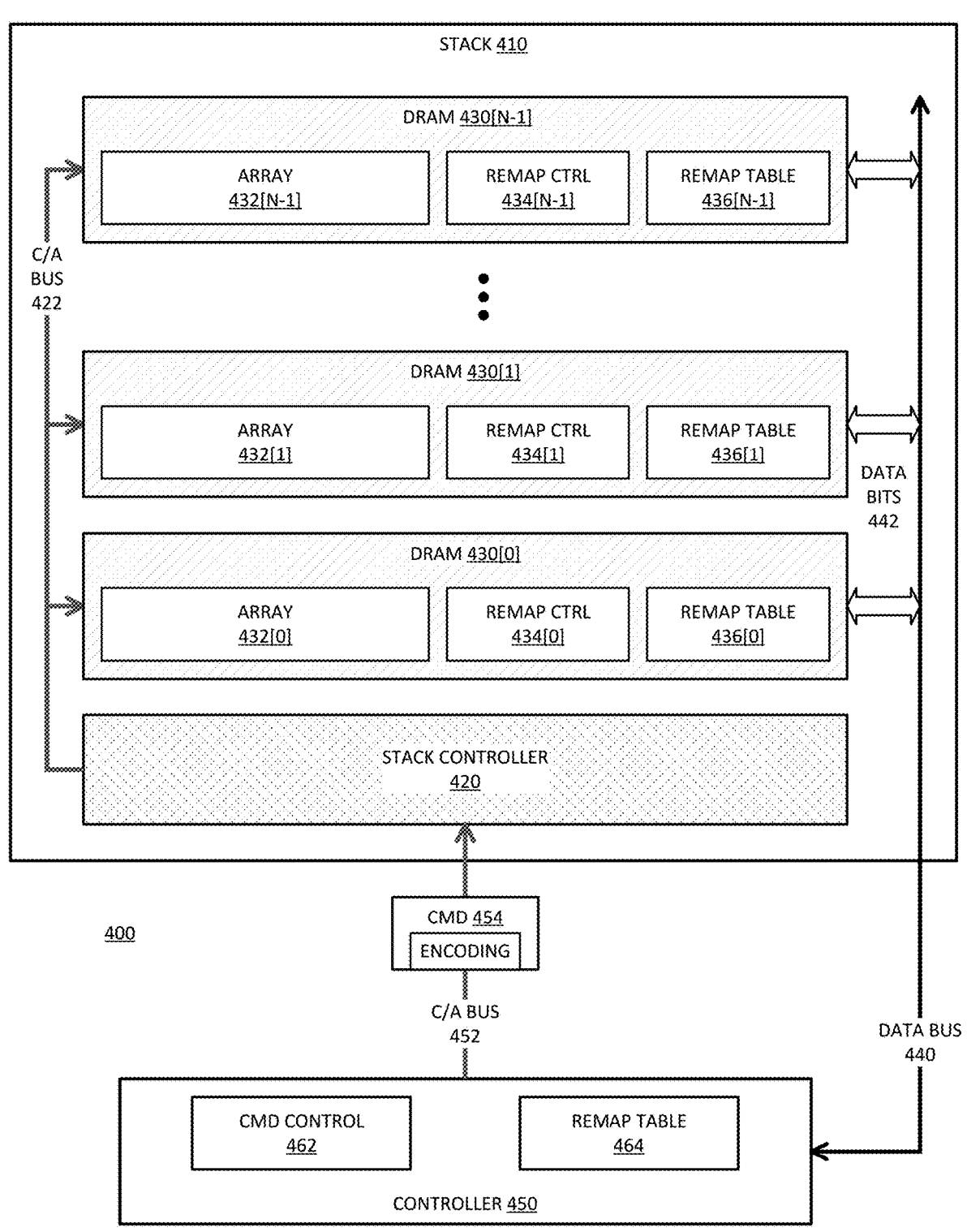
FIG. 4 is a block diagram of an example of a system architecture for a memory stack to implement memory address remapping.

FIG. 4 is a block diagram of an example of a system architecture for a memory stack to implement memory address remapping. System 400 represents a system in accordance with an example of system 100 or an example of system 200.

System 400 illustrates one example of stack 410 with stack controller 420 and memory devices. Stack controller 420 represents a controller for the memory devices of stack 410. In one example, stack controller 420 receives information from controller 450 and buffers the signals to the memory devices over C/A (command/address) bus 422, which represents the command bus on stack 410 as controlled by stack controller 420. C/A bus 422 is typically a unilateral bus or unidirectional bus to carry command and address information from controller 450 to the memory devices.

The memory devices can be memory chips, which are represented as DRAM devices 430[0:(N−1)], or collectively, DRAM devices 430. Stack 410 includes N data DRAM devices, data DRAMs 430[0:(N−1)], where N can be any integer. Data bus 440 represents a bus to exchange data between DRAM devices 430 and controller 450. Data bus 440 is traditionally a bidirectional, point-to-point bus. For simplicity, system 400 does not illustrate control signal lines from DRAM devices 430 to controller 450.

DRAM devices 430 do not specifically illustrate the data bus interface, but can be any interface supported by a DRAM chip, which is typically a binary number. The DQ interface of each DRAM can send a portion of data bits 442 to data bus 440 for a read, or receive a portion of data bits 442 from data bus 440 for a write. Controller 450 receives data bits 442 from DRAM devices 430 as input data on data bus 440 for a Read, and provides data bits 442 to DRAM devices 430 as output data on data bus 440 for a Write. The Read or Write data is sent on the data bus corresponding to a command sent on C/A (command/address) bus 452. The command sent on C/A bus 452 includes address information, which DRAM devices 430 may apply directly for the data access operation, or they may remap the address information.

Controller 450 includes command (CMD) control 462, which represents logic at controller 450 to send commands to DRAM devices 430. In one example, controller 450 includes remap table 464, which represents a table or other store of data to indicate how DRAM devices 430 are configured to interpret address information.

In one example, controller 450 sends command (CMD) 454 on C/A bus 452. Command 454 has command encoding that indicates what type of command is being sent to the DRAM devices. In one example, command 454 includes command encoding that indicates a remap mode, to trigger DRAM devices 430 to remap the address information associated with the command to access different parts of the memory.

DRAM devices 430[0:(N−1)] respectively include array 432[0:(N−1)] (collectively, array 432), remap control (CTRL) 434[0:(N−1)] (collectively, remap control 434), and remap table 436[0:(N−1)] (collectively, remap table 436). Array 432 represents the arrays of the DRAM devices. Remap control 434 represents control logic in DRAM devices 430 to selectively remap address information received in a data access command from controller 450. Remap table 436 represents a table of information to identify the pattern of data remapping to be applied by a respective DRAM device 430.

Consider that controller 450 sends command 454, which includes a command encoding to indicate that DRAM devices 430 should remap the address information received. Any two adjacent DRAM devices 430 in stack 410 could apply the same remap control, or could apply different remap control, depending on the pattern or configuration of remap table 436. Thus, DRAM device 430[0] could apply the same mapping as DRAM device 430[1], which could both be different than DRAM device 430[N−1]. In another example, DRAM device 430[0], DRAM device 430[1], and DRAM device 430[N−1] could all apply different mapping of address information. Examples follow in FIG. 5, FIG. 6A, FIG. 6B, and FIG. 7 of different address mapping patterns.

In one example, remap control 434 includes the ability to internally generate a write enable (WR_EN) or a read enable (RD_EN) to implement the remapping. Remap control 434 can receive the address information of command 454, access remap table 436, and set appropriate bits to enable the accessing to the desired rows or columns. The write enable and read enable in the DRAM devices can be fine-grained control to enable elaborate remapping patterns. Sub-write-enable control is needed for some remapping patterns, instead of simple chip enable (CE), which would typically be sufficient. Some remap patterns can be accomplished with CE. In one example, controller 450 only provides the CE signal, and DRAM devices 430 internally generate additional enable control to implement the remap pattern.

With specific enable control, the row address or cacheline can be spread across DRAM devices 430 in configurable ways. With the control in system 400, a single stack 410 can be used for different applications that require different data widths, without needing to change the hardware configuration of the stack. Thus, in system 400, the effective width of stack 410 can be varied for different regions of memory. In different configurations, system 400 can allow DRAM space for extra metadata to be allocated without wasting any extra DRAM space or requiring the DRAM to be a different internal size.

Perhaps more applicable for stack 410 than having a single configuration that can be applied in different systems is that stack 410 can be made to include different numbers of DRAM devices without resulting in wasted capacity due to a mismatch of native stack interface width with the host data width. As such, stack 410 can be made with different numbers of devices to provide the desired memory capacity, and the system can apply address remapping to utilize the available memory capacity.

FIG. 5 is a block diagram of an example of memory address remapping for a 6×8 DIMM. System 500 provides an example of a system in accordance with system 300 or system 400. System 500 provides an example of a 6×8 DIMM reading as an equivalent 4×8 with additional address space.

System 500 represents DRAM[1:6] as the DRAM devices of a DIMM. The address space illustrates the address space of the memory array of the DRAM devices. The address space is the space available for access, and mapping under each DRAM device is how the particular DRAM device will map that address space.

For example, DRAM 1, DRAM 2, DRAM 3, and DRAM 4 map addresses 0×0 to 0×7 to addresses 0-7, respectively. Such a mapping is a direct mapping or native mapping for these rows, where the address space is mapped to the address that would be in the memory access command. More precisely, a native mapping would map DIMM address space 0×0 to 0×F to DRAM address space 0×0 to 0×F in every DRAM. DRAM 3 and DRAM 4 are mapped directly for addresses 8-15 as well, mapping address space 0×8 to 0×F to addresses 8-15. DRAM 5 and DRAM 6 map address space 0×8 to 0×F directly to addresses 8-15.

The remapping of system 500 maps address space 0×0 to 0×7 of DRAM 5 and DRAM 6 to addresses 16-23. DRAM 1 and DRAM 2 map address space 0×8 to 0×F to addresses 16-23. With the remapping, in one example, system 500 has the equivalent of DIMM addresses 0-23 instead of DIMM addresses 0-15. DIMM addresses 16-23 are not uniformly mapped to the DRAM internal address space of the command because the DIMM address space does not exist in every DRAM. Thus, address remapping can enable a memory system to remap command addresses to an address range (e.g., row address or column address) that is higher than a maximum address range of the DRAM or memory device.

For system 500, reads from lines 0-15 can be standard, although reads for lines 0-15 will be, respectively, from DRAM 1, DRAM 2, DRAM 3, and DRAM 4 for 0-7, and from DRAM 3, DRAM 4, DRAM 5, and DRAM 6 for 8-15. Writes to lines 0-15 will be special writes, where the DRAM devices determine the write enable (WE) to write to the appropriate location of the appropriate DRAM devices.

Reads to lines 16-23 will be special reads, where the DRAM devices determine the low address. The write to lines 16-23 will also be a special write, where the DRAM devices determine the address and the WE. The additional capacity of the DRAM devices can be accessed by a remapping of address space to an address space outside the maximum native address range of the devices.

FIG. 6A is a block diagram of an example of memory address remapping for a 9×4 implementation for a 10×4 DIMM. System 602 provides an example of a system in accordance with system 300 or system 400. System 602 provides an example of a 10×4 DIMM configuration reading as an equivalent 9×4 configuration with additional address space.

System 602 only illustrates details with respect to DRAM 1, DRAM 2, and DRAM 3. The pattern will continue with other DRAM devices. As illustrated, the system provides an additional 7 lines every 64 lines, because for a 9×4 configuration, the system needs 9 columns of free space. The closest even divisor of 9 into 64 is 7, giving 9*7=63 of 64 lines needed to make free space.

System 602 illustrates a global remap of one of the 7 free spaces in each nine columns to make a new cache line. There will be one column location unused every 64 lines, giving one line out of 64, for only one of ten columns, giving a utilization of 639/640=99.8% of DRAM space utilized. The utilization is to achieve an additional 7 lines every 64, giving 7/64=10.9% of DRAM space utilization.

As illustrated, DRAM 1 maps address space 0×0 to 0×D to lines 0-13, and maps 0×E to 0×14 to additional address (ADDR) space, which is not specifically labeled. DRAM 2 maps address space 0×0 to 0×6 to lines 0-6, address space 0×E to 0×14 to lines 14-20, and address space 0×7 to 0×D to the additional address (ADDR) space. DRAM 3 maps address space 0×0 to 0×6 to the additional address (ADDR) space, and maps address space 0×7 to 0×14 to lines 7-20.

FIG. 6B provides further detail for an implementation of FIG. 6A. System 604 provides an additional address space of lines 64-70 by remapping address space of the DRAM devices. More specifically, rather than 10×4 devices having address space of 0×0 to 0×3F, system 604 will appear to the memory controller to by 9×4 devices (thus, a narrower data interface) with address space 0×0 to 0×46.

All DRAM devices map their address directly between memory array space and command address, except for the chunk of 7 lines of address space taken across the diagonal of the devices. Thus, lines 64-70 (0×40 to 0×46) map to DRAM 9 address space 0×0 . . . 0×6, DRAM 8 address space 0×7 . . . 0×0D, DRAM 7 address space 0×0E . . . 0×14, DRAM 6 address space 0×15 . . . 0×1B, DRAM 5 address space 0×1C . . . 0×22, DRAM 4 address space 0×23 . . . 0×29, DRAM 3 address space 0×2A . . . 0×30, DRAM 2 address space 0×31 . . . 0×37, and DRAM 1 address space 0×38 . . . 0×3E. It will be understood that any diagonal pattern could be used. In the alternative to a diagonal pattern, other patterns could be used.

FIG. 7 is a block diagram of an example of memory address remapping for a 9.25×4 implementation for a 10×4 DIMM. System 700 provides an example of a system in accordance with system 300 or system 400. System 700 provides an example of a 10×4 DIMM configuration reading as an equivalent 9.25×4 configuration with additional address space.

System 700 only illustrates details with respect to DRAM 1, DRAM 2, and DRAM 3. The pattern will continue with other DRAM devices. As illustrated, the system provides an additional 5 lines every 64 lines, because for a 9×4 configuration, the system needs 9 columns of free space. The closest even divisor of 9 into 64 is 7, giving 9*7=63 of 64 lines, where 2 of the lines are used for the 0.25, leaving 5 lines needed to make free space.

To make 5 extra lines, system 700 can have 18 lines for each set of 3 columns, plus an additional 7 lines for a single column (18*3+7=61 lines). 18 is not a good divisor for a remap, but the system can use 16 lines in a simple remap and 2 lines in a global remap, for 2*3+5=11 global remap lines needed.

System 700 illustrates the pattern, with 0×0 to 0×2 mapped to four portions in each of DRAM 1, DRAM 2, and DRAM 3. The four portions mapped for DRAM 1 0×0 include two portions of line 0 (0×2), one portion of line 13 (13×1), and one portion of line 14 (14×1). The four portions mapped for DRAM 1 0×1 include two portions of line 1 (1×2), one portion of line 15 (15×1), and one portion of line 16 (16×1). The four portions mapped for DRAM 10×2 include three portions of line 2 (2×3) and one portion of line 17 (17×1). DRAM 1 also remaps 0×D to 0×11 to the 5 new lines of address space.

The four portions mapped for DRAM 2 0×0 include two portions of line 0 (0×2), one portion of line 8 (8×1), and one portion of line 9 (9×1). The four portions mapped for DRAM 2 0×1 include three portions of line 1 (1×3) and one portion of line 10 (10×1). The four portions mapped for DRAM 2 0×2 include two portions of line 2 (2×2), one portion of line 11 (11×1), and one portion of line 12 (12×1). DRAM 2 also remaps 0×8 to 0×C to the 5 new lines of address space.

The four portions mapped for DRAM 3 0×0 include three portions of line 0 (0×3) and one portion of line 3 (3×1). The four portions mapped for DRAM 3 0×1 include two portions of line 1 (1×2), one portion of line 4 (4×1), and one portion of line 5 (5×1). The four portions mapped for DRAM 3 0×2 include two portions of line 2 (2×2), one portion of line 6 (6×1), and one portion of line 7 (7×1). DRAM 3 also remaps 0×3 to 0×7 to the 5 new lines of address space.

The complexity of system 700 is enabled by the ability of the DRAM devices to separately enable each I/O, to be able to split data into four different parts. It will be understood that not all DRAM devices are illustrated in system 700, and thus, not all portions of each row are illustrated. However, the pattern can continue to other DRAM devices to provide the same number of segments for each row address (9, or 2 full widths plus one quarter).

In general, utilizing approximately the full DIMM space for a 10×4 DIMM configuration, can be accomplished for:
1) a 10×4 configuration where a 9.5×4 configuration is desired, by creating an additional 3 rows of address space for every 64 rows. The system would have 8 Bytes of data for metadata, with 99.4% utilization of the DIMM space.
2) a 10×4 configuration where a 9.25×4 configuration is desired, by creating an additional 5 rows of address space for every 64 rows. The system would have 4 Bytes of data for metadata, with 99.7% utilization of the DIMM space.
3) a 10×4 configuration where a 9×4 configuration is desired, by creating an additional 7 rows of address space for every 64 rows, for 99.8% utilization of the DIMM space.
4) a 10×4 configuration where an 8×4 configuration is desired, by creating an additional 1 row of address space for every 4 rows, for 100% utilization of the DIMM space.

Figure 8:
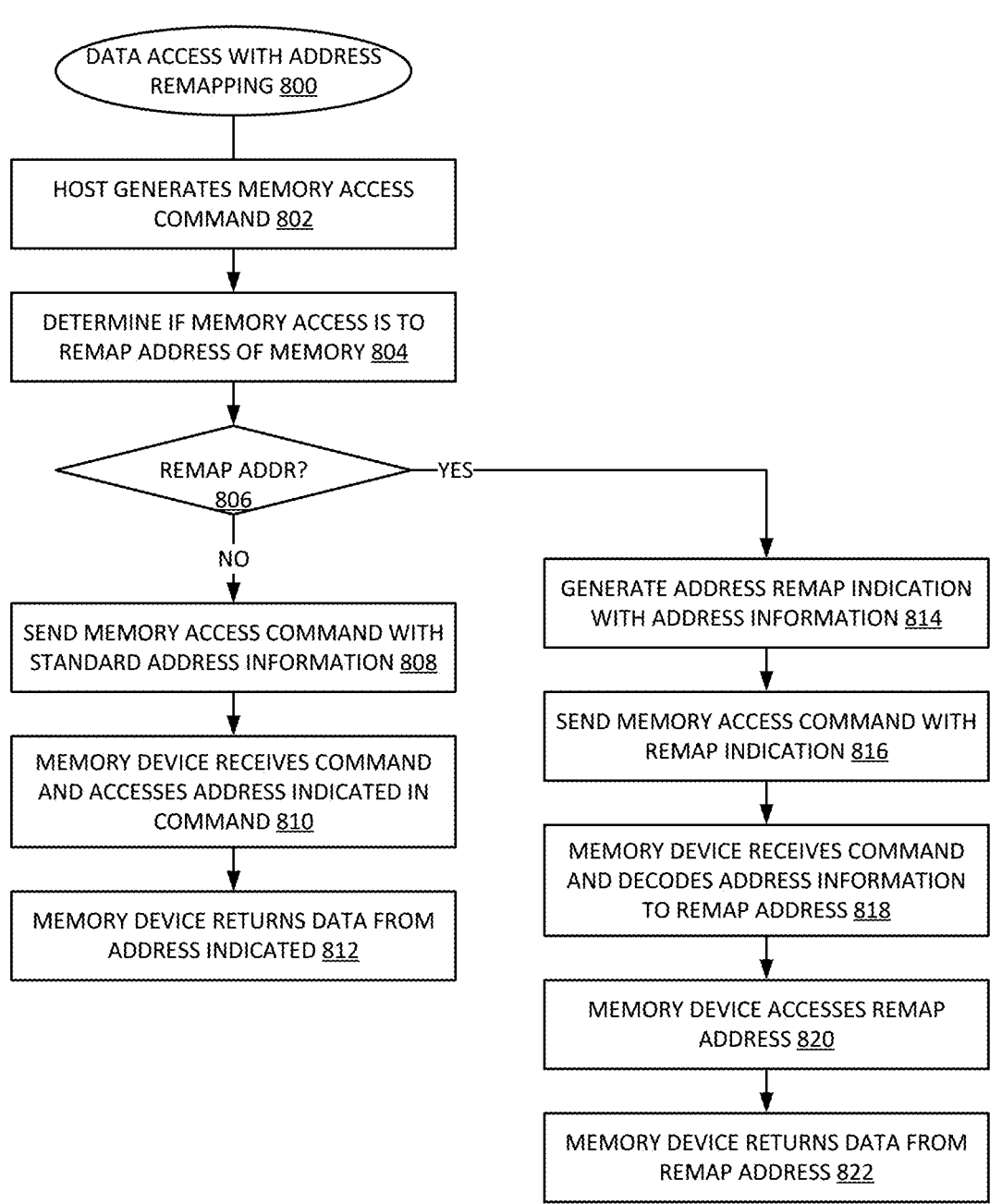
FIG. 8 is a flow diagram of an example of a process for memory data access with address remapping.

FIG. 8 is a flow diagram of an example of a process for memory data access with address remapping. Process 800 represents an example of a process for data access with address remapping. The address remapping can be in accordance with any example herein.

In one example, the host generates a memory access command, at 802. The memory access command can be a read command or a write command. The memory access command has associated address information with it. In one example, the system determines if the memory access command is to remap address space of the memory, at 804.

If the memory access command does not remap the address space, at 806 NO branch, in one example, the memory controller sends the memory access command to the memory with standard address information and no indication of a remap, at 808. The memory devices can receive the command and access the address indicated in the command, at 810. The memory devices return the data from the address indicated in the command, at 812, for a read access, and return an indication of write complete for a write access.

If the memory access command remaps the address space, at 806 YES branch, in one example, the memory controller generates an address remap indication with the address information to send to the memory, at 814. The indication can be, for example, a special command encoding or a special mode. The memory controller can send the memory access command to the memory with the remap indication, at 816.

In one example, the memory devices receive the command decode the address information to remap the address, at 818. Different memory devices in parallel can remap the address information differently. The memory devices access the remap address, at 820, which can include internally generating enable signals to enable different portions of the I/O for the device. The memory devices return the data from the remap address, at 822, for a read access, and return an indication of write complete for a write access.

Figure 9:
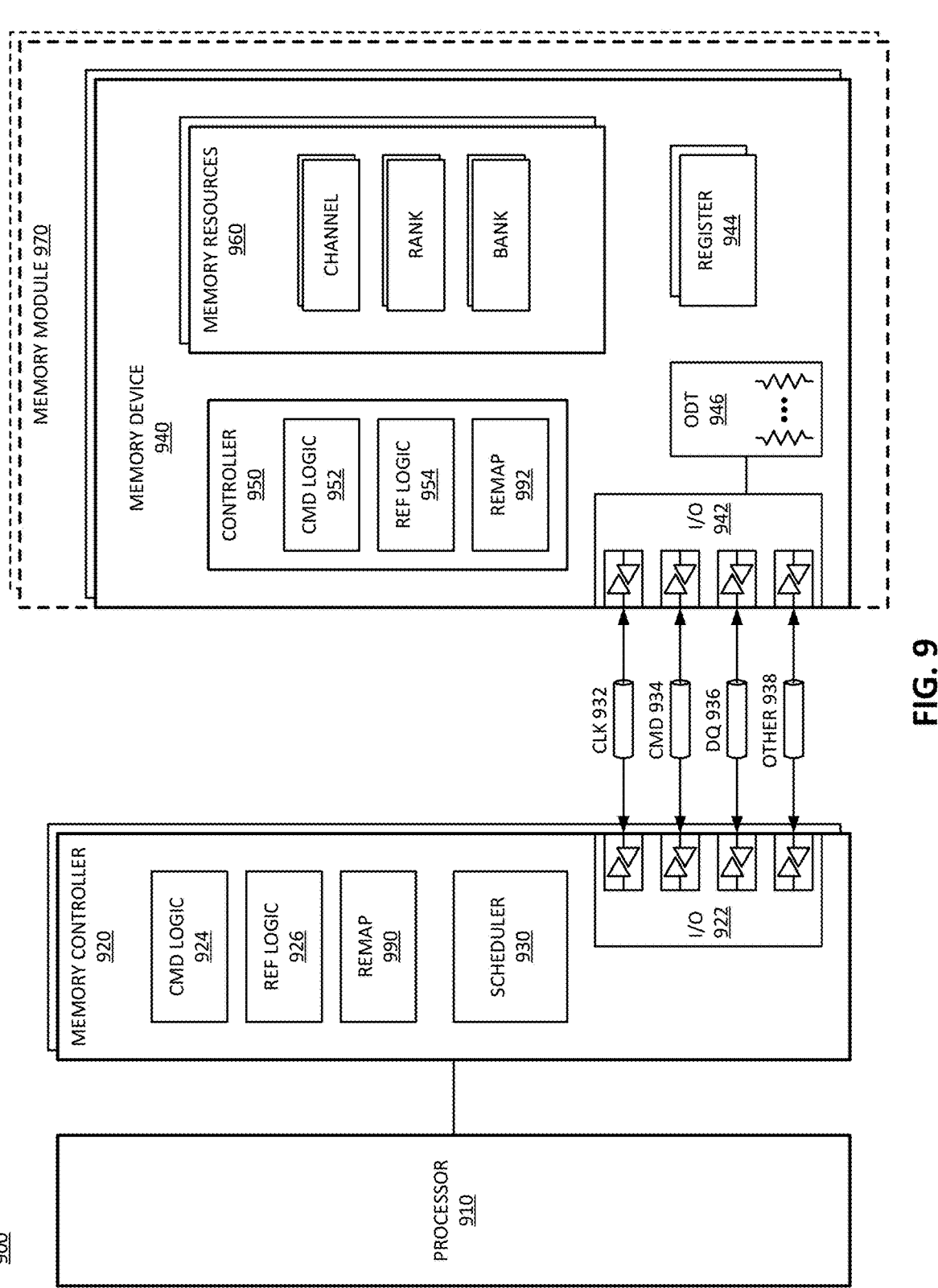
FIG. 9 is a block diagram of an example of a memory subsystem in which data address remapping can be implemented.

FIG. 9 is a block diagram of an example of a memory subsystem in which data address remapping can be implemented. System 900 includes a processor and elements of a memory subsystem in a computing device. System 900 represents a system in accordance with an example of system 100, system 200, system 300, or system 400.

In one example, memory controller 920 includes remap logic 990. Remap logic 990 enables memory controller 920 to keep track of remapping patterns for memory devices 940. In one example, memory device 940 includes remap 992 to be able to remap address space in response to a remap mode. In the remap mode, memory devices 940 map address space for an incoming command to rows of memory resources 960 based on the command and a remap pattern or remap table. Some rows may be mapped directly to the address of the command, and other rows will be remapped to different address space. Remap 992 can includes the ability to self-enable I/O of the memory device. Memory devices 940 can remap address space in accordance with any example herein.

Memory controller 920 represents one or more memory controller circuits or devices for system 900. Memory controller 920 represents control logic that generates memory access commands in response to the execution of operations by processor 910. Memory controller 920 accesses one or more memory devices 940. Memory devices 940 can be DRAM devices in accordance with any referred to above. In one example, memory devices 940 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 920 manages a separate memory channel, although system 900 can be configured to have multiple channels managed by a single controller, or to have multiple controllers on a single channel. In one example, memory controller 920 is part of host processor 910, such as logic implemented on the same die or implemented in the same package space as the processor.

Processor 910 represents a processing unit of a computing platform that may execute an operating system (OS) and applications, which can collectively be referred to as the host or the user of the memory. The OS and applications execute operations that result in memory accesses. Processor 910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 900 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, JESD79-5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

Memory controller 920 includes I/O interface logic 922 to couple to a memory bus, such as a memory channel as referred to above. I/O interface logic 922 (as well as I/O interface logic 942 of memory device 940) can include pins, pads, connectors, signal lines, traces, or wires, or other hardware to connect the devices, or a combination of these. I/O interface logic 922 can include a hardware interface. As illustrated, I/O interface logic 922 includes at least drivers/transceivers for signal lines. Commonly, wires within an integrated circuit interface couple with a pad, pin, or connector to interface signal lines or traces or other wires between devices. I/O interface logic 922 can include drivers, receivers, transceivers, or termination, or other circuitry or combinations of circuitry to exchange signals on the signal lines between the devices. The exchange of signals includes at least one of transmit or receive. While shown as coupling I/O 922 from memory controller 920 to I/O 942 of memory device 940, it will be understood that in an implementation of system 900 where groups of memory devices 940 are accessed in parallel, multiple memory devices can include I/O interfaces to the same interface of memory controller 920. In an implementation of system 900 including one or more memory modules 970, I/O 942 can include interface hardware of the memory module in addition to interface hardware on the memory device itself. Other memory controllers 920 will include separate interfaces to other memory devices 940.

The bus between memory controller 920 and memory devices 940 can be implemented as multiple signal lines coupling memory controller 920 to memory devices 940. The bus may typically include at least clock (CLK) 932, command/address (CMD) 934, and write data (DQ) and read data (DQ) 936, and zero or more other signal lines 938. In one example, a bus or connection between memory controller 920 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 920 and memory devices 940. An example of a serial bus technology is 8B10B encoding and transmission of high-speed data with embedded clock over a single differential pair of signals in each direction. In one example, CMD 934 represents signal lines shared in parallel with multiple memory devices. In one example, multiple memory devices share encoding command signal lines of CMD 934, and each has a separate chip select (CS_n) signal line to select individual memory devices.

It will be understood that in the example of system 900, the bus between memory controller 920 and memory devices 940 includes a subsidiary command bus CMD 934 and a subsidiary bus to carry the write and read data, DQ 936. In one example, the data bus can include bidirectional lines for read data and for write/command data. In another example, the subsidiary bus DQ 936 can include unidirectional write signal lines for write and data from the host to memory, and can include unidirectional lines for read data from the memory to the host. In accordance with the chosen memory technology and system design, other signals 938 may accompany a bus or sub bus, such as strobe lines DQS. Based on design of system 900, or implementation if a design supports multiple implementations, the data bus can have more or less bandwidth per memory device 940. For example, the data bus can support memory devices that have either a ×4 interface, a ×8 interface, a ×16 interface, or other interface. The convention "×W," where W is an integer that refers to an interface size or width of the interface of memory device 940, which represents a number of signal lines to exchange data with memory controller 920. The interface size of the memory devices is a controlling factor on how many memory devices can be used concurrently per channel in system 900 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 940 and memory controller 920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 940 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 940 represent memory resources for system 900. In one example, each memory device 940 is a separate memory die. In one example, each memory device 940 can interface with multiple (e.g., 2) channels per device or die. Each memory device 940 includes I/O interface logic 942, which has a bandwidth determined by the implementation of the device (e.g., ×16 or ×8 or some other interface bandwidth). I/O interface logic 942 enables the memory devices to interface with memory controller 920. I/O interface logic 942 can include a hardware interface, and can be in accordance with I/O 922 of memory controller, but at the memory device end. In one example, multiple memory devices 940 are connected in parallel to the same command and data buses. In another example, multiple memory devices 940 are connected in parallel to the same command bus, and are connected to different data buses. For example, system 900 can be configured with multiple memory devices 940 coupled in parallel, with each memory device responding to a command, and accessing memory resources 960 internal to each. For a Write operation, an individual memory device 940 can write a portion of the overall data word, and for a Read operation, an individual memory device 940 can fetch a portion of the overall data word. The remaining bits of the word will be provided or received by other memory devices in parallel.

In one example, memory devices 940 are disposed directly on a motherboard or host system platform (e.g., a PCB (printed circuit board) on which processor 910 is disposed) of a computing device. In one example, memory devices 940 can be organized into memory modules 970. In one example, memory modules 970 represent dual inline memory modules (DIMMs). In one example, memory modules 970 represent other organization of multiple memory devices to share at least a portion of access or control circuitry, which can be a separate circuit, a separate device, or a separate board from the host system platform. Memory modules 970 can include multiple memory devices 940, and the memory modules can include support for multiple separate channels to the included memory devices disposed on them. In another example, memory devices 940 may be incorporated into the same package as memory controller 920, such as by techniques such as multi-chip-module (MCM), package-on-package, through-silicon via (TSV), or other techniques or combinations. Similarly, in one example, multiple memory devices 940 may be incorporated into memory modules 970, which themselves may be incorporated into the same package as memory controller 920. It will be appreciated that for these and other implementations, memory controller 920 may be part of host processor 910.

Memory devices 940 each include one or more memory arrays 960. Memory array 960 represents addressable memory locations or storage locations for data. Typically, memory array 960 is managed as rows of data, accessed via wordline (rows) and bitline (individual bits within a row) control. Memory array 960 can be organized as separate channels, ranks, and banks of memory. Channels may refer to independent control paths to storage locations within memory devices 940. Ranks may refer to common locations across multiple memory devices (e.g., same row addresses within different devices) in parallel. Banks may refer to sub-arrays of memory locations within a memory device 940. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 940 include one or more registers 944. Register 944 represents one or more storage devices or storage locations that provide configuration or settings for the operation of the memory device. In one example, register 944 can provide a storage location for memory device 940 to store data for access by memory controller 920 as part of a control or management operation. In one example, register 944 includes one or more Mode Registers. In one example, register 944 includes one or more multipurpose registers. The configuration of locations within register 944 can configure memory device 940 to operate in different "modes," where command information can trigger different operations within memory device 940 based on the mode. Additionally or in the alternative, different modes can also trigger different operation from address information or other signal lines depending on the mode. Settings of register 944 can indicate configuration for I/O settings (e.g., timing, termination or ODT (on-die termination) 946, driver configuration, or other I/O settings).

In one example, memory device 940 includes ODT 946 as part of the interface hardware associated with I/O 942. ODT 946 can be configured as mentioned above, and provide settings for impedance to be applied to the interface to specified signal lines. In one example, ODT 946 is applied to DQ signal lines. In one example, ODT 946 is applied to command signal lines. In one example, ODT 946 is applied to address signal lines. In one example, ODT 946 can be applied to any combination of the preceding. The ODT settings can be changed based on whether a memory device is a selected target of an access operation or a non-target device. ODT 946 settings can affect the timing and reflections of signaling on the terminated lines. Careful control over ODT 946 can enable higher-speed operation with improved matching of applied impedance and loading. ODT 946 can be applied to specific signal lines of I/O interface 942, 922 (for example, ODT for DQ lines or ODT for CA lines), and is not necessarily applied to all signal lines.

Memory device 940 includes controller 950, which represents control logic within the memory device to control internal operations within the memory device. For example, controller 950 decodes commands sent by memory controller 920 and generates internal operations to execute or satisfy the commands. Controller 950 can be referred to as an internal controller, and is separate from memory controller 920 of the host. Controller 950 can determine what mode is selected based on register 944, and configure the internal execution of operations for access to memory resources 960 or other operations based on the selected mode. Controller 950 generates control signals to control the routing of bits within memory device 940 to provide a proper interface for the selected mode and direct a command to the proper memory locations or addresses. Controller 950 includes command logic 952, which can decode command encoding received on command and address signal lines. Thus, command logic 952 can be or include a command decoder. With command logic 952, memory device can identify commands and generate internal operations to execute requested commands.

Referring again to memory controller 920, memory controller 920 includes command (CMD) logic 924, which represents logic or circuitry to generate commands to send to memory devices 940. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 940, memory controller 920 can issue commands via I/O 922 to cause memory device 940 to execute the commands. In one example, controller 950 of memory device 940 receives and decodes command and address information received via I/O 942 from memory controller 920. Based on the received command and address information, controller 950 can control the timing of operations of the logic and circuitry within memory device 940 to execute the commands. Controller 950 is responsible for compliance with standards or specifications within memory device 940, such as timing and signaling requirements. Memory controller 920 can implement compliance with standards or specifications by access scheduling and control.

Memory controller 920 includes scheduler 930, which represents logic or circuitry to generate and order transactions to send to memory device 940. From one perspective, the primary function of memory controller 920 could be said to schedule memory access and other transactions to memory device 940. Such scheduling can include generating the transactions themselves to implement the requests for data by processor 910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 920 typically includes logic such as scheduler 930 to allow selection and ordering of transactions to improve performance of system 900. Thus, memory controller 920 can select which of the outstanding transactions should be sent to memory device 940 in which order, which is typically achieved with logic much more complex that a simple first-in first-out algorithm. Memory controller 920 manages the transmission of the transactions to memory device 940, and manages the timing associated with the transaction. In one example, transactions have deterministic timing, which can be managed by memory controller 920 and used in determining how to schedule the transactions with scheduler 930.

In one example, memory controller 920 includes refresh (REF) logic 926. Refresh logic 926 can be used for memory resources that are volatile and need to be refreshed to retain a deterministic state. In one example, refresh logic 926 indicates a location for refresh, and a type of refresh to perform. Refresh logic 926 can trigger self-refresh within memory device 940, or execute external refreshes which can be referred to as auto refresh commands) by sending refresh commands, or a combination. In one example, controller 950 within memory device 940 includes refresh logic 954 to apply refresh within memory device 940. In one example, refresh logic 954 generates internal operations to perform refresh in accordance with an external refresh received from memory controller 920. Refresh logic 954 can determine if a refresh is directed to memory device 940, and what memory resources 960 to refresh in response to the command.

Figure 10:
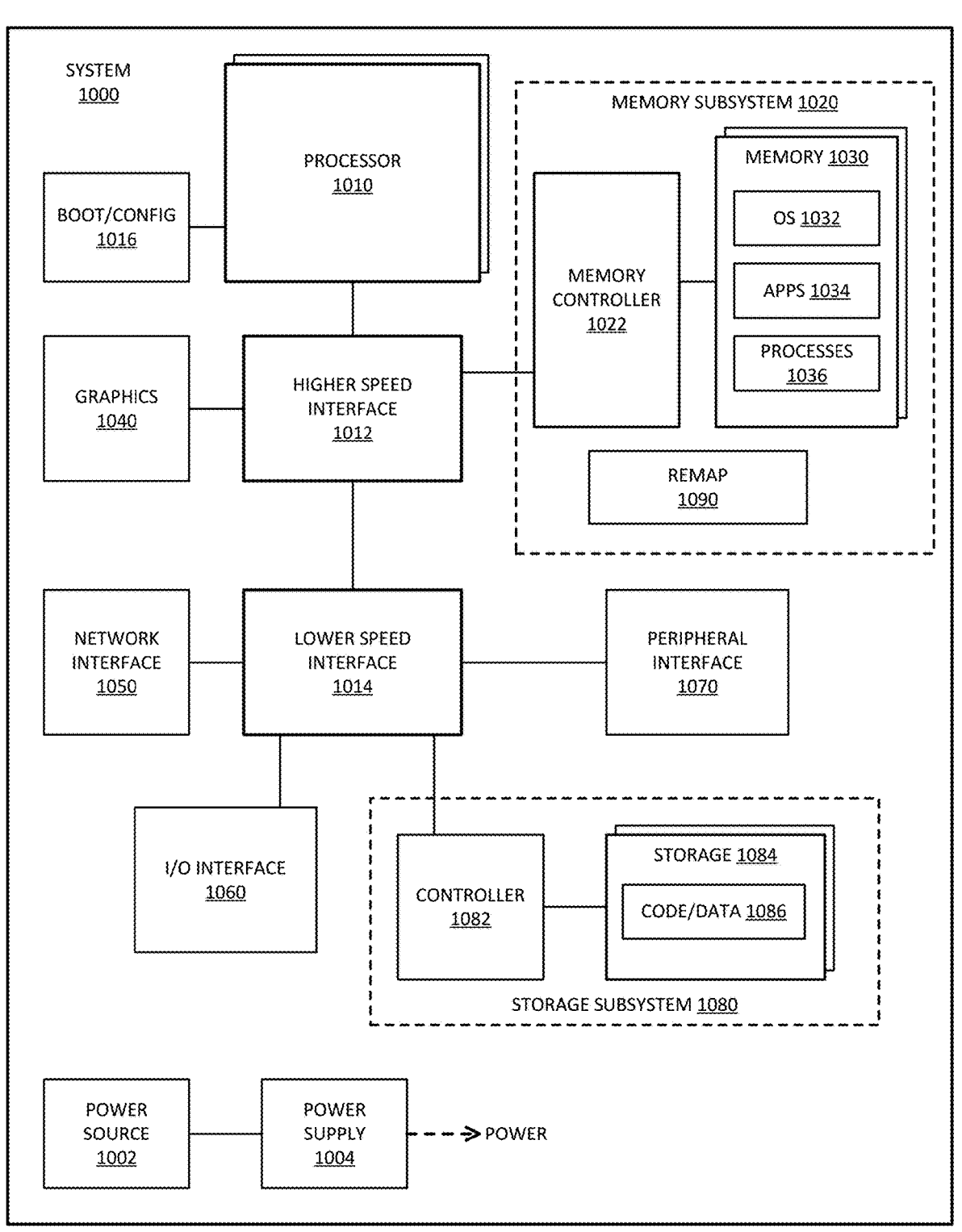
FIG. 10 is a block diagram of an example of a computing system in which data address remapping can be implemented.

FIG. 10 is a block diagram of an example of a computing system in which data address remapping can be implemented. System 1000 represents a computing device in accordance with any example herein, and can be a laptop computer, a desktop computer, a tablet computer, a server, a gaming or entertainment control system, embedded computing device, or other electronic device.

System 1000 represents a system in accordance with an example of system 100, system 200, system 300, or system 400. In one example, memory subsystem 1020 includes remap logic 1090. Remap logic 1090 enables memory controller 1022 to keep track of remapping patterns for memory 1030, and enables memory 1030 to remap address space in response to a remap mode. In the remap mode, memory 1030 map address space for an incoming command to rows of memory based on the command and a remap pattern or remap table. Some rows may be mapped directly to the address of the command, and other rows will be remapped to different address space. Remap 1090 can includes the ability to self-enable I/O of the memory. Memory 1030 can remap address space in accordance with any example herein.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 can be a host processor device. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

System 1000 includes boot/config 1016, which represents storage to store boot code (e.g., basic input/output system (BIOS)), configuration settings, security hardware (e.g., trusted platform module (TPM)), or other system level hardware that operates outside of a host OS. Boot/config 1016 can include a nonvolatile storage device, such as read-only memory (ROM), flash memory, or other memory devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display or ultra high definition (UHD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more varieties of random-access memory (RAM) such as DRAM, 3DXP (three-dimensional crosspoint), or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, NAND, 3DXP, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1000 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
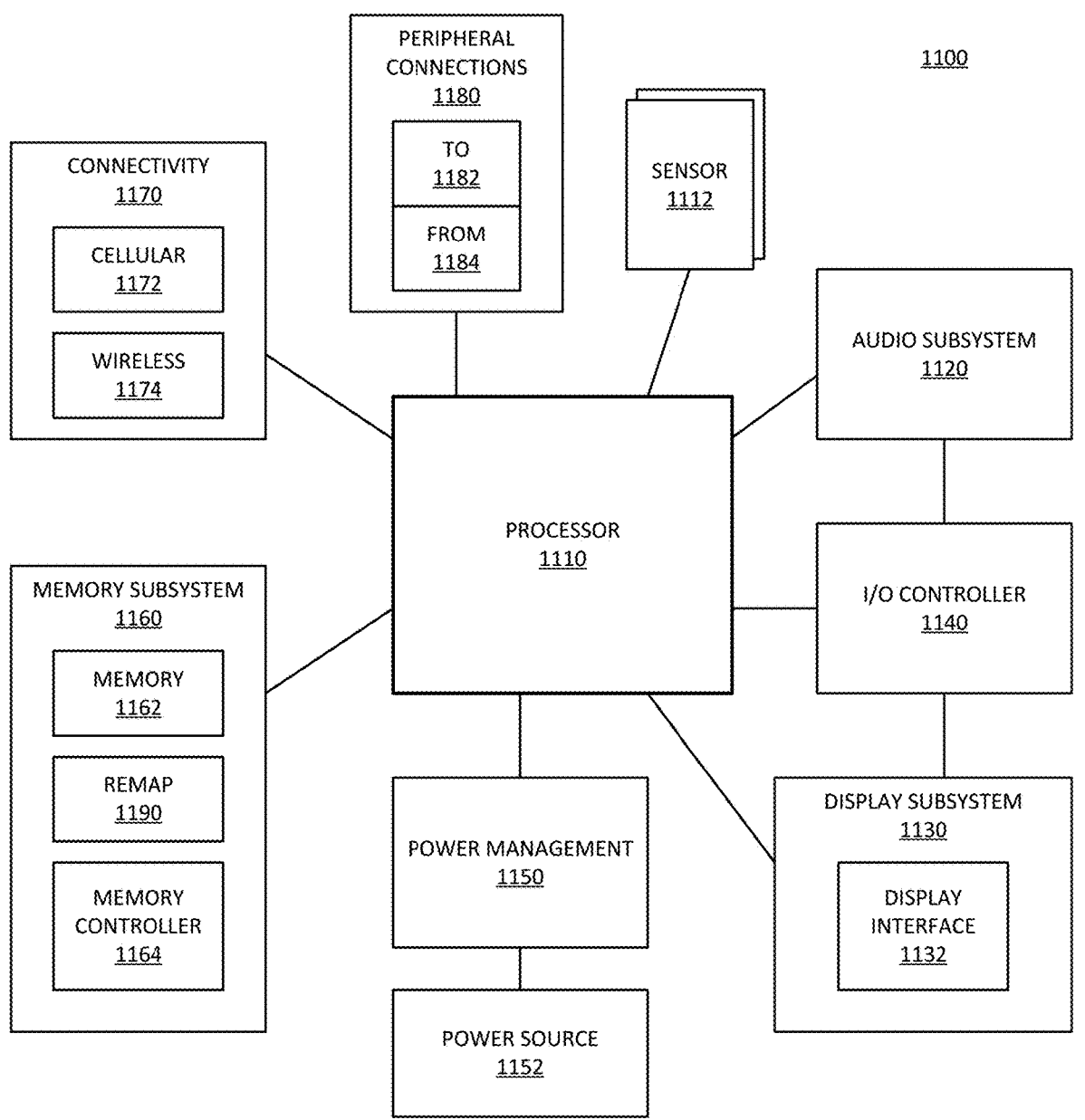
FIG. 11 is a block diagram of an example of a mobile device in which data address remapping can be implemented.

FIG. 11 is a block diagram of an example of a mobile device in which data address remapping can be implemented. System 1100 represents a mobile computing device, such as a computing tablet, a mobile phone or smartphone, wearable computing device, or other mobile device, or an embedded computing device. It will be understood that certain of the components are shown generally, and not all components of such a device are shown in system 1100.

System 1100 represents a system in accordance with an example of system 100, system 200, system 300, or system 400. In one example, memory subsystem 1160 includes remap logic 1190. Remap logic 1190 enables memory controller 1164 to keep track of remapping patterns for memory 1162, and enables memory 1162 to remap address space in response to a remap mode. In the remap mode, memory 1162 map address space for an incoming command to rows of memory based on the command and a remap pattern or remap table. Some rows may be mapped directly to the address of the command, and other rows will be remapped to different address space. Remap 1190 can includes the ability to self-enable I/O of the memory. Memory 1162 can remap address space in accordance with any example herein.

System 1100 includes processor 1110, which performs the primary processing operations of system 1100. Processor 1110 can be a host processor device. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting system 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, system 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1100, or connected to system 1100. In one example, a user interacts with system 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to system 1100 through which a user might interact with the system. For example, devices that can be attached to system 1100 might include microphone devices, speaker or stereo systems, video systems or other display device, keyboard or keypad devices, buttons/switches, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of system 1100. Additionally, audio output can be provided instead of or in addition to display output. In another example, if display subsystem includes a touchscreen, the display device also acts as an input device, which can be at least partially managed by I/O controller 1140. There can also be additional buttons or switches on system 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in system 1100, or sensors 1112. The input can be part of direct user interaction, as well as providing environmental input to the system to influence its operations (such as filtering for noise, adjusting displays for brightness detection, applying a flash for a camera, or other features).

In one example, system 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in system 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system

1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable system 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, system 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that system 1100 could both be a peripheral device ("to" 1182) to other computing devices, as well as have peripheral devices ("from" 1184) connected to it. System 1100 commonly has a "docking" connector to connect to other computing devices for purposes such as managing (e.g., downloading, uploading, changing, synchronizing) content on system 1100. Additionally, a docking connector can allow system 1100 to connect to certain peripherals that allow system 1100 to control content output, for example, to audiovisual or other systems.

In addition to a proprietary docking connector or other proprietary connection hardware, system 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 12:
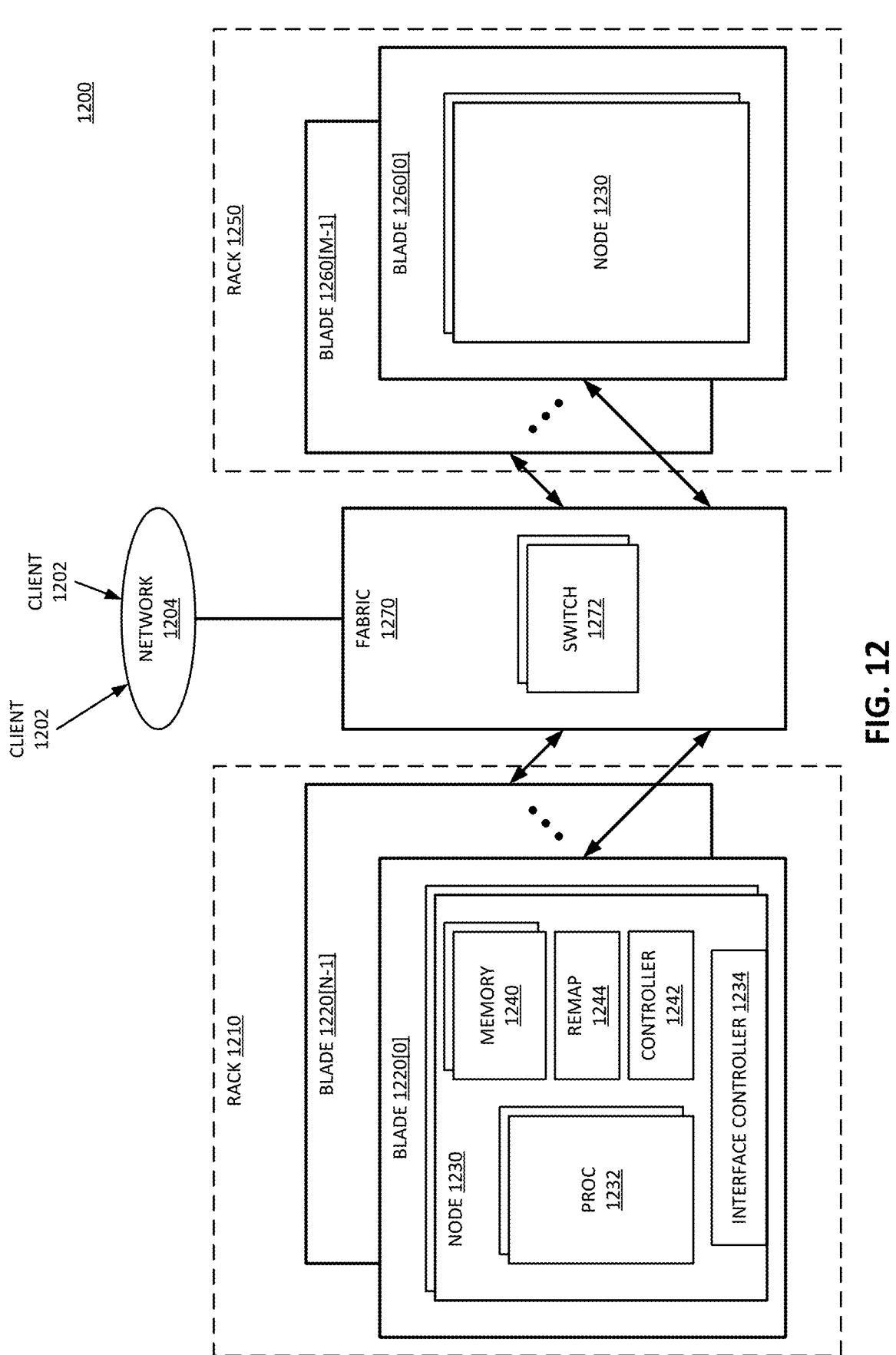
FIG. 12 is a block diagram of an example of a multi-node network in which data address remapping can be implemented.

FIG. 12 is a block diagram of an example of a multi-node network in which data address remapping can be implemented. System 1200 represents a network of nodes that can apply adaptive ECC. In one example, system 1200 represents a data center. In one example, system 1200 represents a server farm. In one example, system 1200 represents a data cloud or a processing cloud.

Node 1230 represents a system in accordance with an example of system 100, system 200, system 300, or system 400. In one example, node 1230 includes remap logic 1244.

Remap logic 1244 enables controller 1242 to keep track of remapping patterns for memory 1240, and enables memory 1240 to remap address space in response to a remap mode. In the remap mode, memory 1240 map address space for an incoming command to rows of memory based on the command and a remap pattern or remap table. Some rows may be mapped directly to the address of the command, and other rows will be remapped to different address space. Remap 1244 can includes the ability to self-enable I/O of the memory. Memory 1240 can remap address space in accordance with any example herein.

One or more clients 1202 make requests over network 1204 to system 1200. Network 1204 represents one or more local networks, or wide area networks, or a combination. Clients 1202 can be human or machine clients, which generate requests for the execution of operations by system 1200. System 1200 executes applications or data computation tasks requested by clients 1202.

In one example, system 1200 includes one or more racks, which represent structural and interconnect resources to house and interconnect multiple computation nodes. In one example, rack 1210 includes multiple nodes 1230. In one example, rack 1210 hosts multiple blade components 1220. Hosting refers to providing power, structural or mechanical support, and interconnection. Blades 1220 can refer to computing resources on printed circuit boards (PCBs), where a PCB houses the hardware components for one or more nodes 1230. In one example, blades 1220 do not include a chassis or housing or other "box" other than that provided by rack 1210. In one example, blades 1220 include housing with exposed connector to connect into rack 1210. In one example, system 1200 does not include rack 1210, and each blade 1220 includes a chassis or housing that can stack or otherwise reside in close proximity to other blades and allow interconnection of nodes 1230.

System 1200 includes fabric 1270, which represents one or more interconnectors for nodes 1230. In one example, fabric 1270 includes multiple switches 1272 or routers or other hardware to route signals among nodes 1230. Additionally, fabric 1270 can couple system 1200 to network 1204 for access by clients 1202. In addition to routing equipment, fabric 1270 can be considered to include the cables or ports or other hardware equipment to couple nodes 1230 together. In one example, fabric 1270 has one or more associated protocols to manage the routing of signals through system 1200. In one example, the protocol or protocols is at least partly dependent on the hardware equipment used in system 1200.

As illustrated, rack 1210 includes N blades 1220. In one example, in addition to rack 1210, system 1200 includes rack 1250. As illustrated, rack 1250 includes M blades 1260. M is not necessarily the same as N; thus, it will be understood that various different hardware equipment components could be used, and coupled together into system 1200 over fabric 1270. Blades 1260 can be the same or similar to blades 1220. Nodes 1230 can be any type of node and are not necessarily all the same type of node. System 1200 is not limited to being homogenous, nor is it limited to not being homogenous.

For simplicity, only the node in blade 1220[0] is illustrated in detail. However, other nodes in system 1200 can be the same or similar. At least some nodes 1230 are computation nodes, with processor (proc) 1232 and memory 1240. A computation node refers to a node with processing resources (e.g., one or more processors) that executes an operating system and can receive and process one or more tasks. In one example, at least some nodes 1230 are server nodes with a server as processing resources represented by processor 1232 and memory 1240. A storage server refers to a node with more storage resources than a computation node, and rather than having processors for the execution of tasks, a storage server includes processing resources to manage access to the storage nodes within the storage server.

In one example, node 1230 includes interface controller 1234, which represents logic to control access by node 1230 to fabric 1270. The logic can include hardware resources to interconnect to the physical interconnection hardware. The logic can include software or firmware logic to manage the interconnection. In one example, interface controller 1234 is or includes a host fabric interface, which can be a fabric interface in accordance with any example described herein.

Processor 1232 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1240 can be or include memory devices and a memory controller.

In general with respect to the descriptions herein, in one example a memory device includes: a configuration register to store one or more bits to indicate an address mapping for a memory array of the memory device, wherein the address mapping is to indicate a remapping of addresses of the memory array to an address higher than a maximum address range of the memory array; input/output (I/O) hardware to receive a memory access command with an address; and control circuitry to access a portion of the memory array in response to the memory access command, the portion of the memory array selected based on the remapping of addresses for the memory array.

In one example of the memory device, the remapping of the addresses of the memory array comprises a remapping of row addresses. In accordance with any preceding example of the memory device, in one example, the control circuitry is to access the portion of the memory array selected based on the remapping of the addresses of the memory array and an indication to apply the remapping of addresses. In accordance with any preceding example of the memory device, in one example, the indication comprises a command encoding. In accordance with any preceding example of the memory device, in one example, the command encoding comprises a command encoding of an activate command. In accordance with any preceding example of the memory device, in one example, the command encoding comprises a command encoding of a read command or a write command. In accordance with any preceding example of the memory device, in one example, the indication comprises the address of the memory access command. In accordance with any preceding example of the memory device, in one example, the configuration register is to store a fixed configuration to indicate the remapping of addresses of the memory array. In accordance with any preceding example of the memory device, in one example, the configuration register is to store a value programmable by a mode register write command. In accordance with any preceding example of the memory device, in one example, the remapping of the addresses of the memory array is to indicate a remapping for row addresses higher than a maximum row address of the memory array. In accordance with any preceding example of the memory device, in one example, the memory device is one of multiple parallel memory devices, and wherein different parallel memory devices are to apply different remappings of addresses. In accordance with any preceding example of the memory device, in one example, the memory device includes: a hardware interface to a data bus, wherein the memory device is to self-enable the hardware interface to the data bus in response to the memory access command.

In general with respect to the descriptions herein, in one example a computer system includes: multiple memory devices connected in parallel, the memory devices including respective configuration registers to store respective values to indicate an address mapping for memory arrays of the respective memory devices, wherein the address mapping is to indicate a remapping of addresses of the memory array to an address higher than a maximum address range of the memory array; memory controller including input/output (I/O) hardware to send a memory access command with an address to the memory devices, wherein the memory devices are to select a portion of the memory array to access in respective memory arrays based on the address and respective remappings of addresses for respective memory arrays.

In one example of the computer system, the remapping of the addresses of the respective memory arrays comprises remapping of row addresses of the respective memory arrays. In accordance with any preceding example of the computer system, in one example, the memory controller is to send an indication to apply the address remapping. In accordance with any preceding example of the computer system, in one example, the indication comprises a command encoding of an activate command, or a read command, or a write command. In accordance with any preceding example of the computer system, in one example, computer system includes: a data bus coupled between the multiple memory devices and the memory controller; wherein the multiple memory devices are to self-enable respective hardware interfaces to the data bus in response to the memory access command. In accordance with any preceding example of the computer system, in one example, the multiple memory devices comprise memory devices of a dual inline memory module (DIMM), wherein different memory devices of the DIMM are to apply different address mappings. In accordance with any preceding example of the computer system, in one example, data memory devices of the DIMM are to directly map an address of the memory access command to the memory array, and metadata memory devices are to apply the address remapping. In accordance with any preceding example of the computer system, in one example, the multiple memory devices comprise memory devices of a multichip package with a stack of multiple memory devices, wherein different memory devices of the multichip package are to apply different address mappings. In accordance with any preceding example of the computer system, in one example, computer system includes: a multicore host processor coupled to the memory controller. In accordance with any preceding example of the computer system, in one example, the computer system includes a display communicatively coupled to a processor. In accordance with any preceding example of the computer system, in one example, the computer system includes a network interface communicatively coupled to a processor. In accordance with any preceding example of the computer system, in one example, the computer system includes a battery to power the computer system.

In general with respect to the descriptions herein, in one example a method includes: receiving a memory access command from a memory controller at a memory device, the memory access command having an address; determining if the memory access command has an associated remapping indication; applying a of the address of the memory access command directly to an address of a memory array of the memory device when the memory access command does not have an associated remapping indication; and applying an address remapping for the memory array based on the address when the memory access command has an associated remapping indication.

In one example of the method, determining if the memory access command has the associated remapping indication comprises decoding a command encoding of the memory access command. In accordance with any preceding example of the method, in one example, the method includes: receiving a mode register write command to configure the address remapping.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
a configuration register to store one or more bits to indicate an address mapping for a memory array of the memory device, wherein the address mapping is to indicate a remapping of addresses of the memory array to an address higher than a maximum address range of the memory array;
input/output (I/O) hardware to receive a memory access command with an address higher than the maximum address range of the memory array; and
control circuitry to access a portion of the memory array in response to the memory access command, the portion of the memory array selected based on the remapping of addresses for the memory array, wherein the remapping of the addresses of the memory array is to indicate a remapping for row addresses higher than a maximum row address of the memory array.

2. The memory device of claim 1, wherein the remapping of the addresses of the memory array comprises a remapping of row addresses.

3. The memory device of claim 1, wherein the control circuitry is to access the portion of the memory array selected based on the remapping of the addresses of the memory array and an indication to apply the remapping of addresses.

4. The memory device of claim 3, wherein the indication comprises a command encoding.

5. The memory device of claim 4, wherein the command encoding comprises a command encoding of an activate command.

6. The memory device of claim 4, wherein the command encoding comprises a command encoding of a read command or a write command.

7. The memory device of claim 3, wherein the indication comprises the address of the memory access command.

8. The memory device of claim 1, wherein the configuration register is to store a fixed configuration to indicate the remapping of addresses of the memory array.

9. The memory device of claim 1, wherein the configuration register is to store a value programmable by a mode register write command.

10. The memory device of claim 1, wherein the memory device is one of multiple parallel memory devices, and wherein different parallel memory devices are to apply different remappings of addresses.

11. The memory device of claim 1, further comprising:
a hardware interface to a data bus, wherein the memory device is to self-enable the hardware interface to the data bus in response to the memory access command.

12. A computer system, comprising:
multiple memory devices connected in parallel, the memory devices including respective configuration registers to store respective values to indicate an address mapping for memory arrays of the respective memory devices, wherein the address mapping is to indicate a remapping of addresses of the memory array to an address higher than a maximum address range of the memory array;
memory controller including input/output (I/O) hardware to send a memory access command with an address to the memory devices, wherein the memory devices are to select a portion of the memory array to access in respective memory arrays based on the address and respective remappings of addresses for respective memory arrays, wherein the respective remappings of the addresses of the respective memory arrays is to indicate remapping for row address higher than a maximum row address of the respective memory array.

13. The computer system of claim 12, wherein the remapping of the addresses of the respective memory arrays comprises remapping of row addresses of the respective memory arrays.

14. The computer system of claim 12, wherein the memory controller is to send an indication to apply the address remapping.

15. The computer system of claim 14, wherein the indication comprises a command encoding of an activate command, or a read command, or a write command.

16. The computer system of claim 12, further comprising:
a data bus coupled between the multiple memory devices and the memory controller;
wherein the multiple memory devices are to self-enable respective hardware interfaces to the data bus in response to the memory access command.

17. The computer system of claim 12, wherein the multiple memory devices comprise memory devices of a dual inline memory module (DIMM), wherein different memory devices of the DIMM are to apply different address mappings.

18. The computer system of claim 17, wherein data memory devices of the DIMM are to directly map an address of the memory access command to the memory array, and metadata memory devices are to apply the address remapping.

19. The computer system of claim 12, wherein the multiple memory devices comprise memory devices of a multichip package with a stack of multiple memory devices, wherein different memory devices of the multichip package are to apply different address mappings.

20. The computer system of claim 12, wherein one or more of:
further comprising a multicore host processor coupled to the memory controller;
the computer system includes a display communicatively coupled to a processor;
the computer system includes a network interface communicatively coupled to a processor; or
the computer system includes a battery to power the computer system.

* * * * *